US010509149B2

(12) United States Patent
Ohyama et al.

(10) Patent No.: US 10,509,149 B2
(45) Date of Patent: Dec. 17, 2019

(54) ORGANIC LIGHT EMITTING DIODE DEVICE

(71) Applicant: SAMSUNG ELECTRONICS CO., LTD., Suwon-si (KR)

(72) Inventors: Tsuyoshi Ohyama, Suwon-si (KR); Kitae Park, Suwon-si (KR); Hyunseok Choi, Anyang-si (KR); Ju Hyun Kim, Anyang-si (KR)

(73) Assignee: SAMSUNG ELECTRONICS CO., LTD., Gyeonggi-Do (KR)

(*) Notice: Subject to any disclaimer, the term of this patent is extended or adjusted under 35 U.S.C. 154(b) by 208 days.

(21) Appl. No.: 15/244,624

(22) Filed: Aug. 23, 2016

(65) Prior Publication Data
US 2017/0285234 A1 Oct. 5, 2017

(30) Foreign Application Priority Data
Apr. 5, 2016 (KR) .................. 10-2016-0041561

(51) Int. Cl.
*G02B 5/30* (2006.01)
*H01L 27/32* (2006.01)
*H01L 51/52* (2006.01)

(52) U.S. Cl.
CPC ......... *G02B 5/3016* (2013.01); *G02B 5/3083* (2013.01); *H01L 27/3232* (2013.01); *H01L 51/5265* (2013.01); *H01L 51/5275* (2013.01); *H01L 51/5281* (2013.01)

(58) Field of Classification Search
CPC .............. G02F 2001/133541; H01L 51/5281
See application file for complete search history.

(56) References Cited

U.S. PATENT DOCUMENTS

| 6,565,974 | B1 | 5/2003 | Uchiyama et al. | |
| 6,797,985 | B1* | 9/2004 | Meng | H01L 27/12 257/103 |
| 8,066,905 | B2 | 11/2011 | Suemasu | |
| 8,119,026 | B2 | 2/2012 | Parri et al. | |
| 2006/0132677 | A1* | 6/2006 | Asao | G02F 1/133514 349/106 |
| 2008/0048558 | A1* | 2/2008 | Song | H01L 51/5281 313/504 |
| 2009/0161044 | A1* | 6/2009 | Ge | G02F 1/133555 349/98 |
| 2012/0249931 | A1* | 10/2012 | Tamaki | G02F 1/133634 349/96 |

(Continued)

FOREIGN PATENT DOCUMENTS

| JP | 3325560 | 9/2002 |
| JP | 4335567 | 9/2009 |

(Continued)

OTHER PUBLICATIONS

Extended European Search Report—European Patent Application No. 17150515.9 dated Aug. 16, 2017, citing references listed within.

(Continued)

*Primary Examiner* — Alexander P Gross
(74) *Attorney, Agent, or Firm* — Cantor Colburn LLP

(57) ABSTRACT

An organic light emitting diode device includes an organic light emitting display panel and a circular polarizing plate disposed on the organic light emitting display panel and including a polarizer and a compensation film, where a retardation of the compensation film in a first direction is determined based on a retardation of the organic light emitting display panel in the first direction.

29 Claims, 19 Drawing Sheets

(56) References Cited

U.S. PATENT DOCUMENTS

| | | | |
|---|---|---|---|
| 2013/0216803 A1* | 8/2013 | Sun | C08J 5/043 |
| | | | 428/216 |
| 2014/0203245 A1* | 7/2014 | Gupta | H01L 51/5203 |
| | | | 257/40 |
| 2014/0293420 A1 | 10/2014 | Ko et al. | |
| 2014/0375935 A1 | 12/2014 | Yamada et al. | |
| 2015/0042927 A1 | 2/2015 | Kim et al. | |
| 2015/0131031 A1 | 5/2015 | Kim et al. | |
| 2017/0047555 A1* | 2/2017 | Ishiguro | B32B 7/02 |

FOREIGN PATENT DOCUMENTS

| | | |
|---|---|---|
| JP | 2010522892 | 7/2010 |
| JP | 1548726 | 9/2010 |
| JP | 2015106114 | 6/2015 |
| WO | 2014156311 | 10/2014 |

OTHER PUBLICATIONS

Daisuke Yokoyama, et al., "In situ real-time spectroscopic ellipsometry measurement for the investigation of molecular orientation in organic amorphous multilayer structures", Journal of Applied Physics, vol. 107, pp. 123512-123512-7, (2010).

Jörg Frischeisen, et al., "Increased light outcoupling efficiency in dye-doped small molecule organic light-emitting diodes with horizontally oriented emitters", Organic Electronics, vol. 12, (2011), pp. 809-817.

* cited by examiner

ORGANIC LIGHT EMITTING DIODE DEVICE

CROSS-REFERENCE TO RELATED APPLICATION

This application claims priority to Korean Patent Application No. 10-2016-0041561, filed on Apr. 5, 2016, and all the benefits accruing therefrom under 35 U.S.C. § 119, the content of which in its entirety is herein incorporated by reference.

BACKGROUND

1. Field

Embodiments of the invention relate to an organic light emitting diode device.

2. Description of the Related Art

Recently, as demand has increased for lightness and thinness of a monitor, a television or the like, an organic light emitting diode ("OLED") device has drawn attention. The organic light emitting diode device, as a self-luminescent device, may operate without using a separate backlight, and thus may realize a thin and flexible display device.

However, metal electrodes and metal wires of an organic light emitting diode device may reflect external light, and visibility and a contrast ratio of an organic light emitting diode device may be deteriorated by reflection of the external light, deteriorating display quality.

SUMMARY

A circular polarizing plate having predetermined optical properties may be attached to a surface of an organic light emitting display panel to reduce reflection of the external light. The circular polarizing plate may reduce external emission of the reflected light and realizes anti-reflection effects.

An embodiment provides an organic light emitting diode device with improved display characteristics by effectively realizing anti-reflection effects.

Another embodiment provides a circular polarizing plate applicable to the organic light emitting diode device.

Yet another embodiment provides a compensation film in the circular polarizing plate.

According to an embodiment, an organic light emitting diode device includes an organic light emitting display panel and a circular polarizing plate disposed on the organic light emitting display panel and including a polarizer and a compensation film, where a retardation of the compensation film in a first direction is determined based on a retardation of the organic light emitting display panel in the first direction.

In an embodiment, the retardation of the compensation film in the first direction may be different from a retardation of the compensation film in the first direction set to allow at least one of reflectance and a reflection color of the circular polarizing plate in a side direction, which is measured while a reflector is disposed under the circular polarizing plate, to be minimum.

In an embodiment, the retardation of the compensation film in the first direction may satisfy Relationship Inequation 1.

$$|R_{c2}|-|R_{c1}|>0 \quad \text{[Relationship Inequation 1]}$$

In Relationship Inequation 1, $R_{c2}$ denotes the retardation of the compensation film in the first direction, and $R_{c1}$ denotes a retardation of the compensation film in the first direction set to allow at least one of reflectance and a reflection color of the circular polarizing plate in a side direction, which is measured while a reflector is disposed under the circular polarizing plate, to be minimum.

In an embodiment, the retardation of the compensation film in the first direction may satisfy Relationship Inequation 2.

$$|R_{c1}-R_p|\times 0.6 \leq R_{c2} \leq |R_{c1}-R_p|\times 1.4 \quad \text{[Relationship Inequation 2]}$$

In the Relationship Inequation 2, $R_{c2}$ denotes the retardation of the compensation film in the first direction, $R_{c1}$ denotes a retardation of the compensation film in the first direction set to allow at least one of reflectance and a reflection color of the circular polarizing plate in a side direction, which is measured while a reflector is disposed on one surface the circular polarizing plate, to be minimum, and $R_p$ denotes the retardation of the organic light emitting display panel in the first direction.

In an embodiment, the retardation of the compensation film in the first direction may satisfy Relationship Inequation 3.

$$|R_{c1}-R_p|\times 0.8 \leq R_{c2} \leq |R_{c1}-R_p|\times 1.2 \quad \text{[Relationship Inequation 3]}$$

In Relationship Inequation 3, $R_{c2}$ denotes the retardation of the compensation film in the first direction, $R_{c1}$ denotes a retardation of the compensation film in the first direction set to allow at least one of reflectance and a reflection color of the circular polarizing plate in a side direction, which is measured while a reflector is disposed under the circular polarizing plate, to be minimum, and $R_p$ denotes the retardation of the organic light emitting display panel in the first direction.

In an embodiment, the retardation of the compensation film in the first direction may be a thickness direction retardation of the compensation film, and the retardation of the organic light emitting display panel in the first direction may be a thickness direction retardation of the organic light emitting display panel.

In an embodiment, the organic light emitting display panel may have refractive indices satisfying Relationship Inequations 5 and 6.

$$n_{xp}>n_{zp} \quad \text{[Relationship Inequation 5]}$$

$$n_{yp}>n_{zp} \quad \text{[Relationship Inequation 6]}$$

In Relationship Inequations 5 and 6, $n_{xp}$ denotes a refractive index of the organic light emitting display panel in a direction where in-plane refractive index is largest, $n_{yp}$ denotes a refractive index of the organic light emitting display panel in a direction where in-plane refractive index is smallest, and $n_{zp}$ denotes a refractive index of the organic light emitting display panel in a thickness direction.

In an embodiment, the organic light emitting display panel may have refractive indices satisfying Relationship Inequation 7.

$$n_{xp}=n_{yp}>n_{zp} \quad \text{[Relationship Inequation 7]}$$

In Relationship Inequation 7, $n_{xp}$ denotes a refractive index of the organic light emitting display panel in a direction where in-plane refractive index is largest, $n_{yp}$ denotes a refractive index of the organic light emitting display panel in a direction where in-plane refractive index is smallest, and $n_{zp}$ denotes a refractive index of the organic light emitting display panel in a thickness direction.

In an embodiment, a thickness direction retardation of the organic light emitting display panel may be in a range from about 20 nanometers (nm) to about 200 nm.

In an embodiment, the compensation film may include a first compensation film having refractive indices satisfying Relationship Inequations 8 and 9 and a second compensation film having a refractive indices satisfying Relationship Inequation 10.

$$n_{x1} > n_{y1} \qquad \text{[Relationship Inequation 8]}$$

$$n_{x1} > n_{z1} \qquad \text{[Relationship Inequation 9]}$$

In Relationship Inequations 8 and 9, $n_{x1}$ denotes a refractive index of the first compensation film in a direction where in-plane refractive index is largest, $n_{y1}$ denotes a refractive index of the first compensation film in a direction where in-plane refractive index is smallest, and $n_{z1}$ denotes a refractive index of the first compensation film in a thickness direction.

$$n_{z2} > n_{x2} = n_{y2} \qquad \text{[Relationship Inequation 10]}$$

In Relationship Inequation 10, $n_{x2}$ denotes a refractive index of the second compensation film in a direction where in-plane refractive index is largest, $n_{y2}$ denotes a refractive index of the second compensation film in a direction where in-plane refractive index is smallest, and $n_{z2}$ denotes a refractive index of the second compensation film in a thickness direction.

In an embodiment, the first compensation film may have an in-plane retardation in a range from about 110 nm to about 160 nm.

In an embodiment, the first compensation film may include a third compensation film having an in-plane retardation in a range from about 110 nm to about 160 nm and a fourth compensation film having an in-plane retardation in a range from about 220 nm to about 320 nm.

In an embodiment, the organic light emitting display panel may have refractive indices satisfying Relationship Inequations 5 and 6.

$$n_{xp} > n_{zp} \qquad \text{[Relationship Inequation 5]}$$

$$n_{yp} > n_{zp} \qquad \text{[Relationship Inequation 6]}$$

In Relationship Inequations 5 and 6, $n_{xp}$ denotes a refractive index of the organic light emitting display panel in a direction where in-plane refractive index is largest, $n_{yp}$ denotes a refractive index of the organic light emitting display panel in a direction where in-plane refractive index is smallest, and $n_{zp}$ denotes a refractive index of the organic light emitting display panel in a thickness direction.

In an embodiment, the organic light emitting display panel may have refractive indices satisfying Relationship Inequation 7.

$$n_{xp} = n_{yp} > n_{zp} \qquad \text{[Relationship Inequation 7]}$$

In Relationship Inequation 7, $n_{xp}$ denotes a refractive index of the organic light emitting display panel in a direction where in-plane refractive index is largest, $n_{yp}$ denotes a refractive index of the organic light emitting display panel in a direction where in-plane refractive index is smallest, and $n_{zp}$ denotes a refractive index of the organic light emitting display panel in a thickness direction.

In an embodiment, each of the first compensation film and the second compensation film may include a polymer, a liquid crystal, or a combination thereof.

In an embodiment, the compensation film may include a polymer film having refractive indices satisfying Relationship Inequation 11 or 12.

$$n_{x3} > n_{z3} > n_{y3} \qquad \text{[Relationship Inequation 11]}$$

$$n_{z3} \geq n_{x3} > n_{y3} \qquad \text{[Relationship Inequation 12]}$$

In Relationship Inequations 11 and 12, $n_{x3}$ denotes a refractive index of the polymer film in a direction where in-plane refractive index is largest, $n_{y3}$ denotes a refractive index of the polymer film in a direction where in-plane refractive index is smallest, and $n_{z3}$ denotes a refractive index of the polymer film in a thickness direction.

In an embodiment, the organic light emitting display panel may have refractive indices satisfying Relationship Inequations 5 and 6.

$$n_{xp} > n_{zp} \qquad \text{[Relationship Inequation 5]}$$

$$n_{yp} > n_{zp} \qquad \text{[Relationship Inequation 6]}$$

In Relationship Inequations 5 and 6, $n_{xp}$ denotes a refractive index of the organic light emitting display panel in a direction where in-plane refractive index is largest, $n_{yp}$ denotes a refractive index of the organic light emitting display panel in a direction where in-plane refractive index is smallest, and $n_{zp}$ denotes a refractive index of the organic light emitting display panel in a thickness direction.

In an embodiment, the organic light emitting display panel may have refractive indices satisfying Relationship Inequation n 7.

$$n_{xp} = n_{yp} > n_{zp} \qquad \text{[Relationship Inequation 7]}$$

In Relationship Inequation 7, $n_{xp}$ denotes a refractive index of the organic light emitting display panel in a direction where in-plane refractive index is largest, $n_{yp}$ denotes a refractive index of the organic light emitting display panel in a direction where in-plane refractive index is smallest, and $n_{zp}$ denotes a refractive index of the organic light emitting display panel in a thickness direction.

In an embodiment, the compensation film may include a liquid crystal layer including liquid crystals which are obliquely tilted to a surface of the compensation film, and tilt angles of the liquid crystals with respect to the surface of the compensation film may become gradually larger in a thickness direction of the compensation film.

In an embodiment, the liquid crystal layer may have a first surface facing the organic light emitting display panel and a second surface facing the polarizer, and tilt angles of the liquid crystals with respect to the surface of the compensation film may become gradually larger from the first surface to the second surface in a thickness direction of the compensation film.

In an embodiment, the liquid crystal layer may have a first surface facing the polarizer and a second surface facing the organic light emitting display panel, and tilt angles of the liquid crystals with respect to the surface of the compensation film become gradually larger from the first surface to the second surface in a thickness direction of the compensation film.

In an embodiment, the organic light emitting display panel may have refractive indices satisfying Relationship Inequations 5 and 6.

$$n_{xp} > n_{zp} \quad \text{[Relationship Inequation 5]}$$

$$n_{yp} > n_{zp} \quad \text{[Relationship Inequation 6]}$$

In Relationship Inequations 5 and 6, $n_{xp}$ denotes a refractive index of the organic light emitting display panel in a direction where in-plane refractive index is largest, $n_{yp}$ denotes a refractive index of the organic light emitting display panel in a direction where in-plane refractive index is smallest, and $n_{zp}$ denotes a refractive index of the organic light emitting display panel in a thickness direction.

In an embodiment, the organic light emitting display panel may have refractive indices satisfying Relationship Inequation 7.

$$n_{xp} = n_{yp} > n_{zp} \quad \text{[Relationship Inequation 7]}$$

In Relationship Inequation 7, $n_{xp}$ denotes a refractive index of the organic light emitting display panel in a direction where in-plane refractive index is largest, $n_{yp}$ denotes a refractive index of the organic light emitting display panel in a direction where in-plane refractive index is smallest, and $n_{zp}$ denotes a refractive index of the organic light emitting display panel in a thickness direction.

In an embodiment, the compensation film may further include an alignment layer contacting the liquid crystal layer.

In an embodiment, the organic light emitting display panel may include an organic layer including aligned organic molecules.

In an embodiment, the organic light emitting display panel may include an organic layer including deposited organic molecules.

In an embodiment, the organic light emitting display panel may have a microcavity structure.

According to another embodiment, a circular polarizing plate for an organic light emitting diode device includes a polarizer and a compensation film, where a retardation of the compensation film in a first direction satisfies Relationship Inequation 1.

$$|R_{c2}| - |R_{c1}| > 0 \quad \text{[Relationship Inequation 1]}$$

In Relationship Inequation 1, $R_{c2}$ denotes the retardation of the compensation film in the first direction, $R_{c1}$ denotes a retardation of the compensation film in the first direction set to allow at least one of reflectance and a reflection color of the circular polarizing plate in a side direction, which is measured while a reflector is disposed under the circular polarizing plate, to be minimum.

In such an embodiment, the retardation of the compensation film in the first direction is a thickness direction retardation of the compensation film.

According to another embodiment, a compensation film for a circular polarizing plate has a retardation in a first direction satisfying Relationship Inequation 1.

$$|R_{c2}| - |R_{c1}| > 0 \quad \text{[Relationship Inequation 1]}$$

In Relationship Inequation 1, $R_{c2}$ denotes the retardation of the compensation film in the first direction, and $R_{c1}$ denotes a retardation of the compensation film in the first direction set to allow at least one of reflectance and a reflection color of the circular polarizing plate in a side direction, which is measured while a reflector is disposed on one surface the circular polarizing plate, to be minimum.

In such an embodiment, the retardation of the compensation film in the first direction may be a thickness direction retardation of the compensation film.

BRIEF DESCRIPTION OF THE DRAWINGS

These and/or other features of the invention will become apparent and more readily appreciated from the following detailed description of embodiments thereof, taken in conjunction with the accompanying drawings, in which.

DETAILED DESCRIPTION

Figure 1:
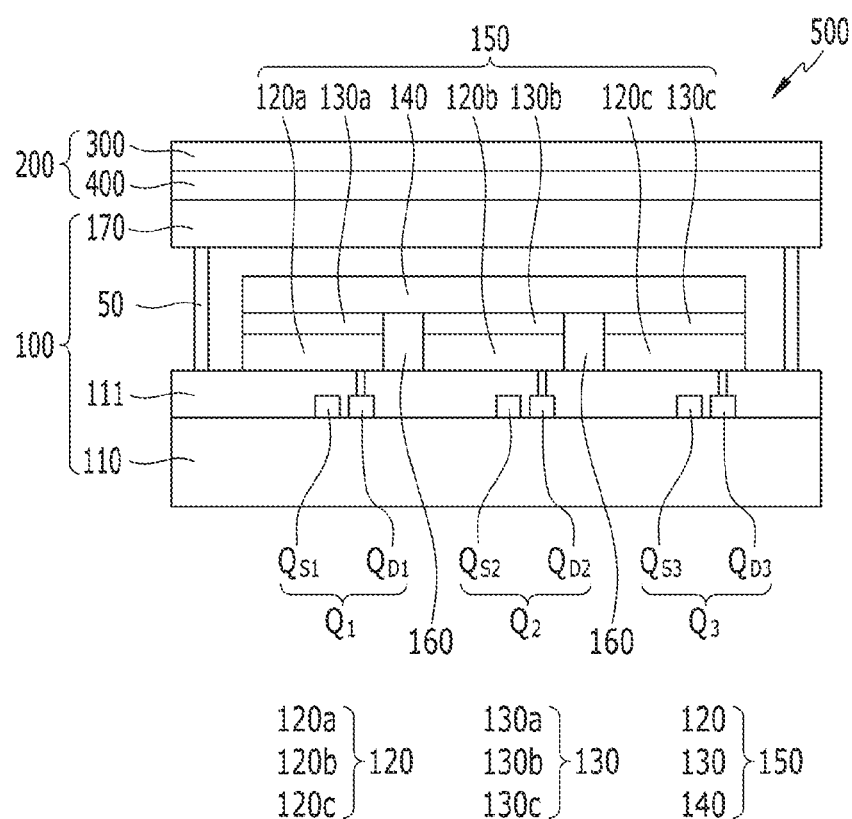
FIG. 1 a cross-sectional view schematically showing an organic light emitting diode device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, exemplary embodiments of an organic light emitting diode device will be described referring to drawings.

FIG. 1 is a cross-sectional view schematically showing an organic light emitting diode device according to an embodiment.

Referring to FIG. 1, an embodiment of an organic light emitting diode device 500 includes an organic light emitting display panel 100 and a circular polarizing plate 200.

In such an embodiment, the organic light emitting display panel 100 includes a plurality of unit pixel groups to display a full color, and the plurality of unit pixel groups may be disposed alternately along a row and/or a column. Each unit pixel group includes a plurality of pixels, and may have, for example, one of various arrangements of a 2×2 matrix, a 3×1 matrix, and the like. Each unit pixel group may include, for example, a red pixel, a green pixel and a blue pixel, and may further include a white pixel. The structures and arrangement of the unit pixel group may be variously modified.

Referring to FIG. 1, the organic light emitting display panel 100 includes a base substrate 110, thin film transistor arrays $Q_1$, $Q_2$, and $Q_3$, on the base substrate 110, an organic light emitting diode 150 and an opposing substrate 170.

In such an embodiment, the base substrate 110 may be a glass substrate, a polymer substrate, or a semiconductor substrate. The polymer substrate may include, for example, polycarbonate, polymethylmethacrylate, polyethyleneterephthalate, polyethylenenaphthalate, polyamide, polyethersulfone, a copolymer thereof, a derivative thereof, or a combination thereof, but is not limited thereto. In an embodiment, where the base substrate 110 is the polymer substrate, organic light emitting diode device may be effectively implemented as a flexible device.

The thin film transistor arrays $Q_1$, $Q_2$, and $Q_3$ include switching thin film transistors $Q_{S1}$, $Q_{S2}$, and $Q_{S3}$ and driving thin film transistors $Q_{D1}$, $Q_{D2}$, and $Q_{D3}$ in each pixel, and the switching thin film transistors $Q_{S1}$, $Q_{S2}$, and $Q_{S3}$ are electrically connected to the driving thin film transistors $Q_{D1}$, $Q_{D2}$, and $Q_{D3}$, respectively.

Each of the switching thin film transistors $Q_{S1}$, $Q_{S2}$, and $Q_{S3}$ includes a control terminal, an input terminal, and an output terminal, where the control terminal is connected to a gate line, the input terminal is connected to a data line, and the output terminal is connected to the driving thin film transistors $Q_{D1}$, $Q_{D2}$, and $Q_{D3}$. The switching thin film transistors $Q_{S1}$, $Q_{S2}$, and $Q_{S3}$ may response a scan signal applied to the gate line, and transmit a data signal to the driving thin film transistors $Q_{D1}$, $Q_{D2}$, and $Q_{D3}$.

Each of the driving thin film transistors $Q_{D1}$, $Q_{D2}$, and $Q_{D3}$ may include a control terminal, an input terminal, and an output terminal, where the control terminal is connected to the switching thin film transistors $Q_{S1}$, $Q_{S2}$, and $Q_{S3}$, the input terminal is connected to a driving voltage line, and the output terminal is connected to the organic light emitting diode 150. The driving thin film transistors $Q_{D1}$, $Q_{D2}$, and $Q_{D3}$ may output an output current having a variable amount or voltage depending on a voltage applied between the control terminal and the output terminal.

In an embodiment, an insulation layer 111 is disposed on the thin film transistor arrays $Q_1$, $Q_2$, and $Q_3$. In such an embodiment, a plurality of contact holes partly exposing the switching thin film transistors $Q_{S1}$, $Q_{S2}$, and $Q_{S3}$ and the driving thin film transistors $Q_{D1}$, $Q_{D2}$, and $Q_{D3}$ are defined or formed in the insulation layer 111.

In an embodiment, the organic light emitting diode 150 is disposed on the insulation layer 111. The organic light emitting diode 150 includes a first organic light emitting diode for displaying a first color, a second organic light emitting diode for displaying a second color, and a third organic light emitting diode for displaying a third color, where the first, second and third colors may be three primary colors, respectively.

The organic light emitting diode 150 may include a lower electrode 120, an organic layer 130, and an upper electrode 140. The lower electrode 120 includes a first lower electrode 120a, a second lower electrode 120b and a third lower electrode 120c disposed in first to third organic light emitting diodes, respectively, and the organic layer 130 includes a first organic layer 130a, a second organic layer 130b and a third organic layer 130c disposed in the first to third organic light emitting diodes, respectively. The upper electrode 140 may be a common electrode commonly disposed in the first to third organic light emitting diodes. In an embodiment, a barrier rib 160 including an insulating material such as polyimide is disposed between the first, second and third organic light emitting diodes.

The lower electrode 120 is connected to the output terminal of the driving thin film transistors $Q_{D1}$, $Q_{D2}$, and $Q_{D3}$, and the upper electrode 140 is connected to a common voltage.

One of the lower electrode 120 and the upper electrode 140 may be an anode, and the other of the lower electrode 120 and the upper electrode 140 may be a cathode. In one embodiment, for example, the lower electrode 120 may be an anode, and the upper electrode 140 may be a cathode. The anode is an electrode into which holes are injected, and may include or be made of a conductive material having a high work function. The cathode is an electrode into which electrons are injected, and may include or be made of a conductive material having a low work function.

At least one of the lower electrode 120 and the upper electrode 140 may include or be made of a transparent or semi-transparent conductive material from which emitted light exits outside. In one embodiment, for example, At least one of the lower electrode 120 and the upper electrode 140 may include or be made of a conductive oxide thin film such as indium tin oxide ("ITO") or indium zinc oxide ("IZO") and/or a metal thin film such as an Ag or Al thin film.

The organic layer 130 includes an emission layer, and may further include an auxiliary layer. The emission layer may include an organic material that intrinsically emits light of red, green, blue or the like, when a voltage is applied to the lower electrode 120 and the upper electrode 140. The auxiliary layer may include a hole transporting layer, a hole injecting layer, an electron injecting layer, and/or an electron transporting layer, to balance electrons and holes, but is not limited thereto. The organic layer 130 may include organic molecules substantially oriented in a direction, where the organic molecules may be deposited, for example, vacuum-deposited.

FIG. 1 shows an embodiment where the organic layer 130 is separated in each pixel, but not being limited thereto. In an alternative embodiment, the organic layer 130 may be provided or formed as a common layer in the organic light emitting diode 150, for example, formed as emission layers for displaying first, second and third colors, respectively, and then, stacked. In such an embodiment, a color filter (not shown) may be further included on or under the organic layer 130.

The lower electrode 120, the organic layer 130 and the upper electrode 140 may exhibit a microcavity effect or define a microcavity structure. The microcavity effect indicates that light of a particular wavelength region is amplified by reinforcement/interference, as light coming from the emission layer is repeatedly reflected between a reflection layer and a (semi)transparent layer spaced apart by a length of an optical path, and thus light corresponding to a resonance wavelength of a microcavity may be reinforced, while light at the other wavelengths may be suppressed.

In an embodiment, one of the lower electrodes and the upper electrodes may include a reflection layer, and the other of the lower electrodes and the upper electrodes may include a (semi)transparent layer, to define the microcavity effect. The light reinforced due to the microcavity effect may have a wavelength range determined depending on an optical path length, and the optical path length may be, for example, determined as a distance between the lower electrodes and the upper electrodes. In an embodiment, the red pixel may have an optical path length through which light in a red wavelength region is selectively amplified, the green pixel may have an optical path length through which light in a green wavelength region is selectively amplified, and the blue pixel may have an optical path length through which light in a blue wavelength region is selectively amplified. In such an embodiment, the microcavity effect may selectively reinforce light in a particular wavelength region in each pixel and thus increase color purity.

The opposing substrate 170 may be, for example, an encapsulation substrate. The encapsulation substrate may include or be made of glass, metal, or a polymer. In such an embodiment, the polymer may include, for example, polyethyleneterephthalate ("PET"), polyvinylalcohol ("PVA"), polycarbonate ("PC"), triacetyl cellulose ("TAC"), a copolymer thereof, a derivative thereof, and/or a combination thereof. The encapsulation substrate may encapsulate the organic light emitting diodes 150 and effectively prevent the inflow of moisture and/or oxygen from the outside. The base substrate 110 and the opposing substrate 170 may be bonded by a sealing material 50.

FIG. 1 shows a structure of an exemplary embodiment of the organic light emitting display panel 100, but the structure of the organic light emitting display panel 100 may be variously modified, and any known organic light emitting display panel may be applied.

The circular polarizing plate 200 may be disposed on the organic light emitting display panel 100 and may be disposed at the light-emitting side of the organic light emitting display panel 100. FIG. 1 shows an embodiment having a top emission structure where light emits at the side of the opposing substrate 170 and the circular polarizing plate 200 is disposed on the opposing substrate 170, but it is not limited thereto. In an alternative embodiment, the organic light emitting display panel 100 may have a bottom emission structure where light emits at the side of the base substrate 110, and the circular polarizing plate 200 may be disposed on an external surface of the base substrate 110.

Figure 2:
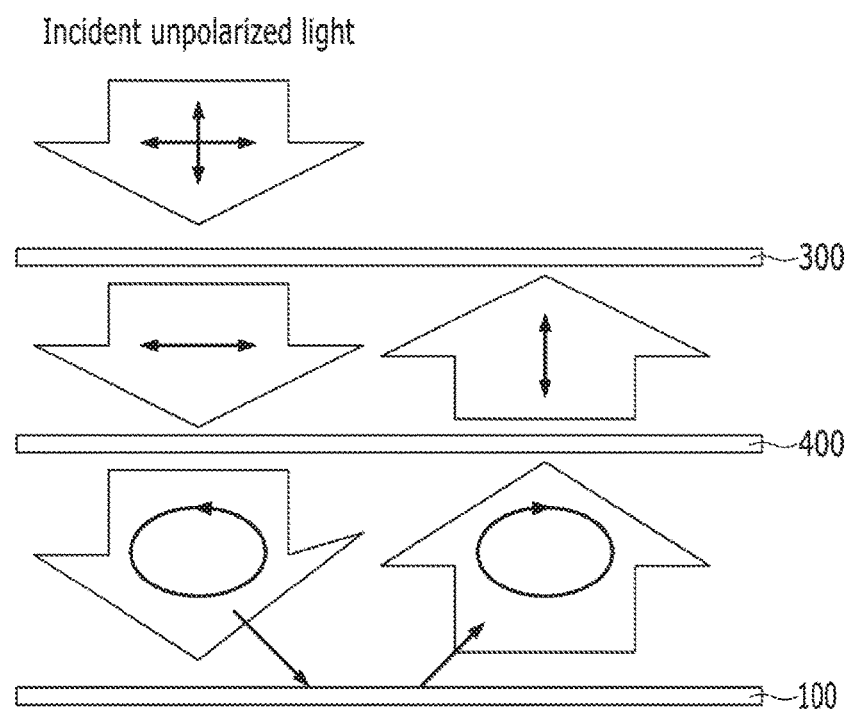
FIG. 2 is a schematic view showing an external light anti-reflection principle of a circular polarizing plate.

In an embodiment, as shown in FIG. 2, the circular polarizing plate 200 includes a polarizer 300 and a compensation film 400.

The polarizer 300 may be a linear polarizer to convert externally incident light (hereinafter, referred to as "incident light") into linear polarized light.

The polarizer 300 may be, for example, a polarizing plate including or made of polyvinylalcohol ("PVA"), and the polarizing plate may be formed according to a method including, for example, drawing a polyvinyl alcohol film, adsorbing iodine or a dichroic dye thereto, and treating the film with boric acid and washing the film.

The polarizer 300 may be, for example, a polarizing film prepared by melt-blending a polymer and a dichroic dye. In an embodiment, the polarizing film may be, for example, made by blending a polymer and a dichroic dye and melting the mixture at a temperature above the melting point of the polymer to manufacture it in a form of a sheet. The polymer may be a hydrophobic polymer, for example, polyolefin.

The compensation film 400 may circularly polarize linearly polarized light passed through the polarizer 300, and thus generate retardation. The retardation may be expressed as an in-plane retardation ($R_e$) and a thickness direction retardation ($R_{th}$). The in-plane retardation ($R_e$) of the compensation film 400 is generated in an in-plane direction of the compensation film 400 and may be obtained based on the following equation: $R_e = (n_x - n_y) \times d$. The thickness direction retardation ($R_{th}$) of the compensation film 400 is generated in a thickness direction of the compensation film 400 and may be obtained based on the following equation: $R_{th} = \{[(n_x+n_y)/2] - n_z\} \times d$. Herein, $n_x$ denotes a refractive index in a direction (hereinafter, referred to as a 'slow axis') where in-plane refractive index of the compensation film 400 is largest, $n_y$ denotes a refractive index in a direction (hereinafter, referred to as a 'fast axis') where in-plane refractive index of the compensation film 400 is smallest, $n_z$ denotes a refractive index in a direction perpendicular to the slow axis and the fast axis of the compensation film 400, and d denotes a thickness of the compensation film 400.

The thickness direction retardation ($R_{th}$) may have a positive or negative value. In one embodiment, for example, where the in-plane retardation ($R_e$) is considerably larger than the thickness direction retardation ($R_{th}$), the thickness direction retardation ($R_{th}$) may have a positive value. In one embodiment, for example, where the thickness direction retardation ($R_{th}$) is considerably larger than the in-plane retardation ($R_e$), the thickness direction retardation ($R_{th}$) may have a negative value.

The compensation film 400 may have a predetermined in-plane retardation and thickness direction retardation by changing the $n_x$, $n_y$, $n_z$, and/or thickness (d).

The retardation of the compensation film 400 may be determined to allow the circular polarizing plate 200 to have a maximum anti-reflection effect and a retardation considering optical anisotropy of the organic light emitting display panel 100.

The retardation set to allow the circular polarizing plate 200 to have a maximum anti-reflection effect may be a retardation when either one of a reflectance and a reflection color in a side direction, which is measured while a reflector is disposed under the circular polarizing plate, is minimized. Herein, the side direction may be a direction in an angle, for example, about 30°, about 45°, or about 60° with reference to a front side.

The optical anisotropy of the organic light emitting display panel 100 may appear due to various factors. In an embodiment, the organic light emitting display panel 100 may show the optical anisotropy by orientation of organic molecules of the organic layer 130. In one embodiment, for example, the organic molecules of the emission layer in the organic layer 130 may be oriented in a same direction to increase a light extraction effect. In one embodiment, for example, the organic layer 130 may be deposited in a vacuum-deposition method, so that the organic molecules may be oriented in a same direction. In one embodiment, for example, the organic molecules of the emission layer and/or the auxiliary layer in the organic layer 130 may be oriented in a same direction to increase charge transportation property of the organic light emitting diode 150. In one embodiment, for example, the organic light emitting display panel 100 may have the optical anisotropy due to a microcavity effect. In one embodiment, for example, the organic light emitting display panel 100 may have the optical anisotropy by an organic material such as polyimide in the organic light emitting display panel 100.

In such an embodiment the anti-reflection effect of the organic light emitting diode display may be further improved by considering a retardation due to the optical anisotropy of the organic light emitting display panel 100, as well as a retardation at a maximum anti-reflection effect of the circular polarizing plate 200, for an optical design of the retardation of the compensation film 400.

When the retardation of the compensation film 400 is determined by a retardation at the maximum anti-reflection effect of the circular polarizing plate 200, the retardation has a difference from a retardation when at least either one of a reflectance and a reflection color in an organic light emitting diode device having the organic light emitting display panel 100 with the circular polarizing plate 200 is minimized, and may deteriorate the anti-reflection effect of the organic light emitting display panel 100.

In an embodiment of the organic light emitting display panel 100, a retardation in a predetermined direction (hereinafter, referred to be a 'first direction'), for example, a thickness direction retardation in the thickness direction, may be mainly generated by the above optical anisotropy.

Accordingly, a retardation of the compensation film 400 in the first direction may be determined or optically designed by considering a retardation of the organic light emitting display panel 100 in the first direction, for example, by offsetting or reinforcing a retardation of the organic light emitting display panel 100 in the first direction.

In one embodiment, for example, a thickness direction retardation of the compensation film 400 may be determined or optically designed by considering a thickness direction retardation of the organic light emitting display panel 100, for example, by offsetting or reinforcing the thickness direction retardation of the organic light emitting display panel 100.

Accordingly, the retardation of the compensation film 400 in the first direction may differ from a retardation of a compensation film determined or optically designed without considering the retardation of the organic light emitting display panel 100 in the first direction, and the retardation of the compensation film 400 in the first direction may, for example, satisfy Relationship Inequation 1.

$|R_{c2}| - |R_{c1}| > 0$            [Relationship Inequation 1]

In Relationship Inequation 1, $R_{c2}$ denotes a retardation of the compensation film 400 in the first direction, and $R_{c1}$ denotes a retardation of the compensation film 400 in the first direction when at least one of reflectance and a reflection color of the circular polarizing plate 200 in a side direction, which is measured while a reflector is disposed under the circular polarizing plate, is minimum.

The retardation of the compensation film 400 satisfying the Relationship Inequation 1 may satisfy, for example, Relationship Inequation 1a.

$$R_{c2}-R_{c1}<0 \quad \text{[Relationship Inequation 1a]}$$

In Relationship Inequation 1a, $R_{c2}$ and $R_{c1}$ are the same as described above.

The retardation of the compensation film 400 in the first direction may satisfy, for example, Relationship Inequation 2 considering a retardation of the organic light emitting display panel 100 in the first direction.

$$|R_{c1}-R_p|\times 0.6 \leq R_{c2} \leq |R_{c1}-R_p|\times 1.4 \quad \text{[Relationship Inequation 2]}$$

In Relationship Inequation 2, $R_{c2}$ denotes a retardation of the compensation film 400 in the first direction, $R_{c1}$ denotes a retardation of the compensation film 400 in the first direction when at least one of reflectance and a reflection color of the circular polarizing plate 200 in a side direction, which is measured while a reflector is disposed under the circular polarizing plate, is minimum, and $R_p$ denotes a retardation of the organic light emitting display panel 100 in the first direction.

The retardation of the compensation film 400 in the first direction may satisfy, for example, Relationship Inequation 3 considering a retardation of the organic light emitting display panel 100 in the first direction.

$$|R_{c1}-R_p|\times 0.8 \leq R_{c2} \leq |R_{c1}-R_p|\times 1.2 \quad \text{[Relationship Inequation 3]}$$

In Relationship Inequation 3, $R_{c2}$ denotes a retardation of the compensation film 400 in the first direction, $R_{c1}$ denotes a retardation of the compensation film 400 in the first direction when at least one of reflectance and a reflection color of the circular polarizing plate 200 in a side direction, which is measured while a reflector is disposed under the circular polarizing plate, is minimum, and $R_p$ denotes a retardation of the organic light emitting display panel 100 in the first direction.

The retardation of the compensation film 400 in the thickness direction may satisfy, for example, Relationship Inequation 4.

$$R_{c2}=((n_x+n_y)/2)-n_z)\times d_c < 0 \quad \text{[Relationship Inequation 4]}$$

In Relationship Inequation 4, $R_{c2}$ denotes a thickness direction retardation of the compensation film 400, $n_x$ denotes a refractive index in a direction where in-plane refractive index of the compensation film 400 is largest, $n_y$ denotes a refractive index in a direction wherein in-plane refractive index of the compensation film 400 is smallest, $n_z$ denotes a refractive index in a thickness direction of the compensation film 400, and $d_c$ denotes a thickness of the compensation film 400.

FIGS. 3 to 7 are schematic views showing various embodiments of the organic light emitting diode device of FIG. 1.

Figure 3:
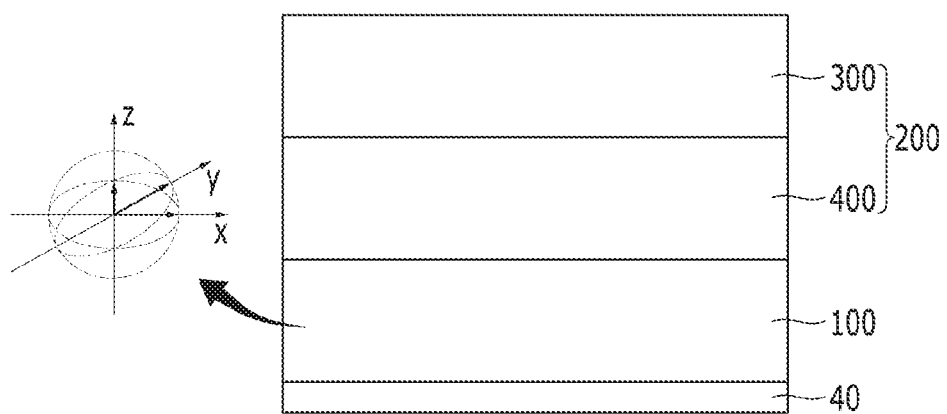
FIGS. 3 to 7 are schematic views showing various embodiments of the organic light emitting diode device of FIG. 1.

Referring to FIG. 3, an embodiment of an organic light emitting diode includes the organic light emitting display panel 100 having predetermined optical anisotropy, and the circular polarizing plate 200 including the polarizer 300 and the compensation film 400.

In one embodiment, for example, the organic light emitting display panel 100 may have predetermined optical anisotropy or, for example, refractive indices satisfying Relationship Inequations 5 and 6.

$$n_{xp}>n_{zp} \quad \text{[Relationship Inequation 5]}$$

$$n_{yp}>n_{zp} \quad \text{[Relationship Inequation 6]}$$

In Relationship Inequations 5 and 6, $n_{xp}$ denotes a refractive index of the organic light emitting display panel 100 in a direction where in-plane refractive index is largest, $n_{yp}$ denotes a refractive index of the organic light emitting display panel 100 in a direction where in-plane refractive index is smallest, and $n_{zp}$ denotes a refractive index of the organic light emitting display panel 100 in a thickness direction.

In one embodiment, for example, the organic light emitting display panel 100 may have predetermined optical anisotropy or, for example, refractive indices satisfying Relationship Inequation 7.

$$n_{xp}=n_{yp}>n_{zp} \quad \text{[Relationship Inequation 7]}$$

In Relationship Inequation 7, $n_{xp}$ is a refractive index of the organic light emitting display panel in a direction where in-plane refractive index 100 is largest, $n_{yp}$ is a refractive index of the organic light emitting display panel in a direction where in-plane refractive index 100 is smallest, and $n_{zp}$ is a refractive index of the organic light emitting display panel in a thickness direction 100.

In Relationship Inequation 7, the $n_{xp}$ and $n_{yp}$ may be substantially equivalent to each other or completely the same as each other. Herein, the $n_{xp}$ and $n_{yp}$ may be regarded as substantially equivalent to each other when the $n_{xp}$ and $n_{yp}$ have a refractive index difference of less than or equal to about 0.01, for example, less than or equal to about 0.001.

In one embodiment, for example, a thickness direction retardation of the organic light emitting display panel 100 may be in a range from about 20 nanometers (nm) to about 200 nm or in a range from about 20 nm to about 100 nm.

The compensation film 400 may be, for example, a λ/4 retardation film and may have, for example, an in-plane retardation ($R_e$) in a range from about 110 nm to about 160 nm for incident light at about 550 nm wavelength.

The compensation film 400 may be, for example, a λ/2 retardation film and may have, for example, an in-plane retardation ($R_e$) in a range from about 220 nm to about 320 nm for incident light at about 550 nm wavelength.

The thickness direction retardation ($R_{th}$) of the compensation film 400 may be determined or designed based on the retardation of the organic light emitting display panel 100 as described above.

The compensation film 400 may include a polymer, a liquid crystal, or a combination thereof.

Figure 4:
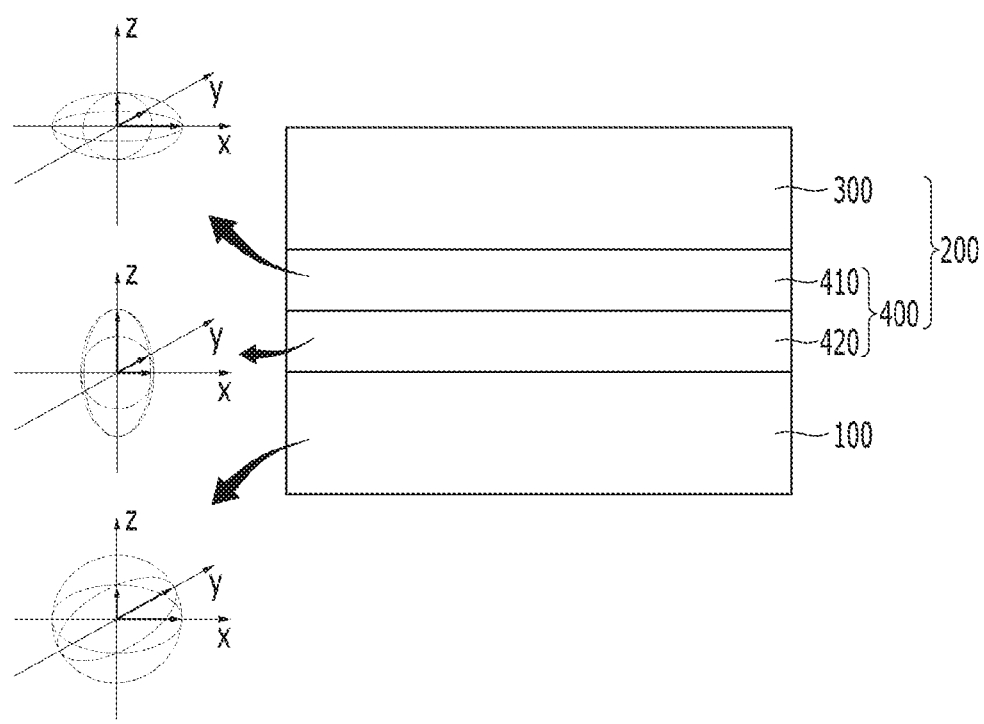

Referring to FIG. 4, an alternative embodiment of the organic light emitting diode device includes the organic light emitting display panel 100 having predetermined optical anisotropy and the circular polarizing plate 200 including the polarizer 300 and the compensation film 400, as in the embodiment described above with reference to FIG. 3. In such an embodiment, the compensation film 400 includes first and second compensation films 410 and 420 having different optical anisotropies from each other.

In such an embodiment, the first compensation film 410 may be, for example, a λ/4 retardation film, and may have, for example an in-plane retardation ($R_e$) in a range from about 110 nm to about 160 nm for incident light at about 550 nm wavelength.

In such an embodiment, the first compensation film 410 may be, for example, a λ/2 retardation film, and may have, for example, an in-plane retardation ($R_e$) in a range from about 220 nm to about 320 nm for incident light at about 550 nm wavelength.

The first compensation film 410 may have, for example, refractive indices of Relationship Inequations 8 and 9.

$$n_{x1} > n_{y1} \qquad \text{[Relationship Inequation 8]}$$

$$n_{x1} > n_{z1} \qquad \text{[Relationship Inequation 9]}$$

In Relationship Inequations 8 and 9, $n_{x1}$ denotes a refractive index in a direction where in-plane refractive index of the first compensation film 410 is largest, $n_{y1}$ denotes a refractive index in a direction where in-plane refractive index of the first compensation film 410 is smallest, and $n_{z1}$ denotes a refractive index in a thickness direction of the first compensation film 410.

The second compensation film 420 may have, for example, refractive indices satisfying Relationship Inequation 10.

$$n_{z2} > n_{x2} = n_{y2} \qquad \text{[Relationship Inequation 10]}$$

In Relationship Inequation 10, $n_{x2}$ denotes a refractive index of the second compensation film in a direction where in-plane refractive index 420 is largest, $n_{y2}$ denotes a refractive index of the second compensation film in a direction where in-plane refractive index 420 is smallest, and $n_{z2}$ denotes a refractive index of the second compensation film in a thickness direction 420.

In Relationship Inequation 10, the $n_{x2}$ and $n_{y2}$ may be substantially equivalent to each other or completely the same as each other. Herein, the $n_{x2}$ and $n_{y2}$ may be regarded as substantially equivalent to each other when the $n_{x2}$ and $n_{y2}$ have a refractive index difference of less than or equal to about 0.01, for example, less than or equal to about 0.001.

The second compensation film 420 is disposed on the first compensation film 410, and thus may decrease or offset a thickness direction retardation of the first compensation film 410 and reduce viewing angle dependency and wavelength dependency.

Each of the first compensation film 410 and the second compensation film 420 may include a polymer, a liquid crystal, or a combination thereof. In one embodiment, for example, the first compensation film 410 may include a polymer film, and the second compensation film 420 may include a liquid crystal layer. In one embodiment, for example, the first compensation film 410 and the second compensation film 420 may each include a liquid crystal layer. In one embodiment, for example, the first compensation film 410 and the second compensation film 420 may each include a polymer film.

In such an embodiment, the organic light emitting display panel 100 may have predetermined optical anisotropy, for example, refractive indices satisfying Relationship Inequations 5 and 6.

$$n_{xp} > n_{zp} \qquad \text{[Relationship Inequation 5]}$$

$$n_{yp} > n_{zp} \qquad \text{[Relationship Inequation 6]}$$

In Relationship Inequations 5 and 6, $n_{xp}$ denotes a refractive index of the organic light emitting display panel in a direction where in-plane refractive index 100 is largest, $n_{yp}$ denotes a refractive index of the organic light emitting display panel in a direction where in-plane refractive index 100 is smallest, and $n_{zp}$ denotes a refractive index of the organic light emitting display panel in a thickness direction 100.

In one embodiment, for example, the organic light emitting display panel 100 may have predetermined optical anisotropy or refractive indices satisfying Relationship Inequation 7.

$$n_{xp} = n_{yp} > n_{zp} \qquad \text{[Relationship Inequation 7]}$$

In Relationship Inequation 7, $n_{xp}$ denotes a refractive index of the organic light emitting display panel in a direction where in-plane refractive index 100 is largest, $n_{yp}$ denotes a refractive index of the organic light emitting display panel in a direction where in-plane refractive index 100 is smallest, and $n_{zp}$ denotes a refractive index of the organic light emitting display panel in a thickness direction 100.

In Relationship Inequation 7, the $n_{xp}$ and $n_{yp}$ may be substantially equivalent to each other or completely the same as each other. Herein, the $n_{xp}$ and $n_{yp}$ may be regarded as substantially equivalent to each other when the $n_{xp}$ and $n_{yp}$ have a refractive index difference of less than or equal to about 0.01, for example, less than or equal to about 0.001.

In one embodiment, for example, a thickness direction retardation of the organic light emitting display panel 100 may be in a range from about 20 nm to about 200 nm, or in a range from about 20 nm to about 100 nm.

Figure 5:
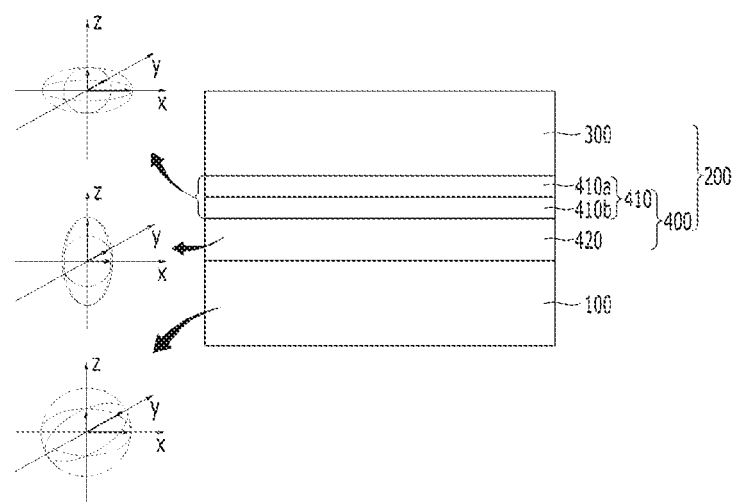

Referring to FIG. 5, another alternative embodiment of the organic light emitting diode device includes the organic light emitting display panel 100 having predetermined optical anisotropy and the circular polarizing plate 200 including the polarizer 300 and the compensation film 400, and the compensation film 400 includes the first compensation film 410 and the second compensation film 420. In such an embodiment, the first compensation film 410 includes a third compensation film 410a and a fourth compensation film 410b having different in-plane retardations from each other.

The third compensation film 410a may be, for example, a λ/2 retardation film, and may have, for example, an in-plane retardation ($R_e$) in a range from about 220 nm to about 320 nm for incident light at about 550 nm wavelength.

The fourth compensation film 410b may be, for example, a λ/4 retardation film, and may have, for example, an in-plane retardation ($R_e$) in a range from about 110 nm to about 160 nm for incident light at about 550 nm wavelength.

The third compensation film 410a and the fourth compensation film 410b may have refractive indices satisfying Relationship Inequations 8 and 9.

The third compensation film 410a and the fourth compensation film 410b having different in-plane retardations may be used to easily realize a predetermined retardation, and thus reduce viewing angle dependency and wavelength dependency.

The second compensation film 420 may have, for example, refractive indices satisfying Relationship Inequation 10.

$$n_{z2} > n_{x2} = n_{y2} \qquad \text{[Relationship Inequation 10]}$$

In Relationship Inequation 10, $n_{x2}$ denotes a refractive index of the second compensation film in a direction where in-plane refractive index 420 is largest, $n_{y2}$ denotes a refractive index of the second compensation film in a direction where in-plane refractive index 420 is smallest, and $n_{z2}$ denotes a refractive index of the second compensation film in a thickness direction 420.

In Relationship Inequation 10, the $n_{x2}$ and $n_{y2}$ may be substantially equivalent to each other or completely the same as each other. Herein, the $n_{x2}$ and $n_{y2}$ may be regarded as substantially equivalent to each other when the $n_{x2}$ and $n_{y2}$ have a refractive index difference of less than or equal to about 0.01, for example, less than or equal to about 0.001.

Each of the third and fourth compensation films 410a and 410b and the second compensation film 420 may include a polymer, a liquid crystal, or a combination thereof. In one embodiment, for example, at least one of the third and fourth compensation films 410a and 410b may include a polymer film, and the second compensation film 420 may include a liquid crystal layer. In one embodiment, for example, the third and fourth compensation films 410a and 410b and the second compensation film 420 may each include a liquid crystal layer. In one embodiment, for example, the third and fourth compensation films 410a and 410b and the second compensation film 420 may each include a polymer film.

The organic light emitting display panel 100 may have optical anisotropy, for example satisfying refractive indices of Relationship Inequations 5 and 6.

$$n_{xp} > n_{zp}$$ [Relationship Inequation 5]

$$n_{yp} > n_{zp}$$ [Relationship Inequation 6]

In Relationship Inequations 5 and 6, $n_{xp}$ denotes a refractive index of the organic light emitting display panel in a direction where in-plane refractive index 100 is largest, $n_{yp}$ denotes a refractive index of the organic light emitting display panel in a direction where in-plane refractive index 100 is smallest, and $n_{zp}$ denotes a refractive index of the organic light emitting display panel in a thickness direction 100.

In one embodiment, for example, the organic light emitting display panel 100 may have predetermined optical anisotropy or refractive indices satisfying Relationship Inequation 7.

$$n_{xp} = n_{yp} > n_{zp}$$ [Relationship Inequation 7]

In Relationship Inequation 7, $n_{xp}$ denotes a refractive index of the organic light emitting display panel in a direction where in-plane refractive index 100 is largest, $n_{yp}$ denotes a refractive index of the organic light emitting display panel in a direction where in-plane refractive index 100 is smallest, and $n_{zp}$ denotes a refractive index of the organic light emitting display panel in a thickness direction 100.

In Relationship Inequation 7, the $n_{xp}$ and $n_{yp}$ may be substantially equivalent to each other or completely the same as each other. Herein, the $n_{xp}$ and $n_{yp}$ may be regarded as substantially equivalent to each other when the $n_{xp}$ and $n_{yp}$ have a refractive index difference of less than or equal to about 0.01, for example, less than or equal to about 0.001.

In one embodiment, for example, a thickness direction retardation of the organic light emitting display panel 100 may be in a range from about 20 nm to about 200 nm, or in a range from about 20 nm to about 100 nm.

Figure 6:
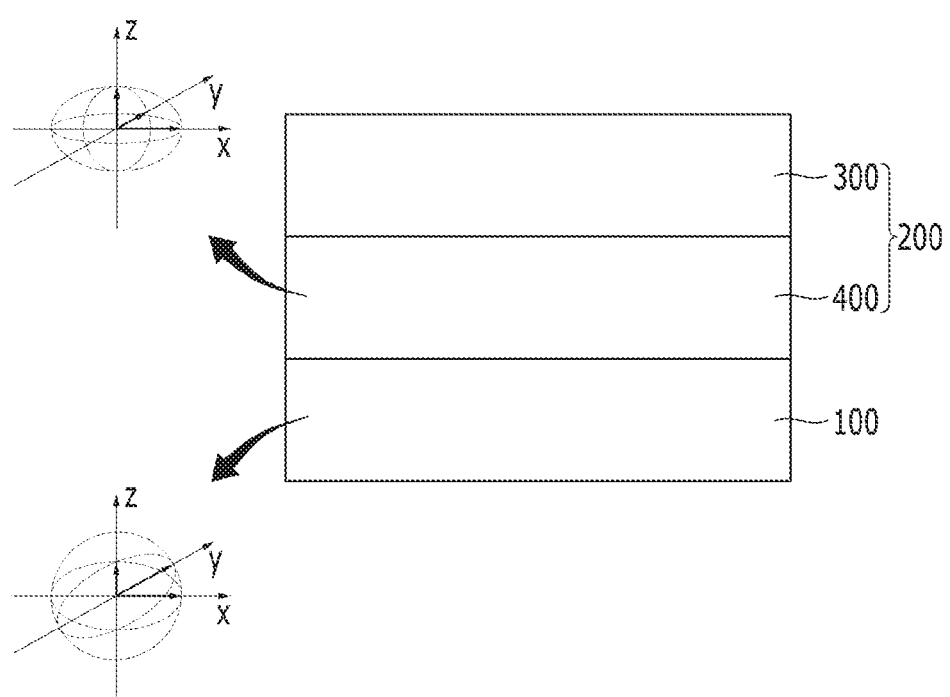

Referring to FIG. 6, another alternative embodiment of the organic light emitting diode device includes the organic light emitting display panel 100 having predetermined optical anisotropy and the circular polarizing plate 200 including the polarizer 300 and the compensation film 400. In such an embodiment, the compensation film 400 may be a polymer film having a refractive index satisfying Relationship Inequation 11 or 12.

$$n_{x3} > n_{z3} > n_{y3}$$ [Relationship Inequation 11]

$$n_{z3} > n_{x3} > n_{y3}$$ [Relationship Inequation 12]

In Relationship Inequations 11 and 12, $n_{x3}$ denotes a refractive index of the polymer film in a direction where in-plane refractive index is largest, $n_{y3}$ denotes a refractive index of the polymer film in a direction where in-plane refractive index is smallest, and $n_{z3}$ denotes a refractive index of the polymer film in a thickness direction.

The polymer film may increase a thickness direction retardation of the compensation film 400 and thus reduce viewing angle dependency. The polymer film may be, for example, biaxially elongated at a predetermined elongation rate to have refractive indices satisfying Relationship Inequations 11 and 12. In one embodiment, for example, the polymer film may be about 1.1 to about 5.0 times elongated in a biaxial direction, but is not limited thereto.

The organic light emitting display panel 100 may have predetermined optical anisotropy, or refractive indices satisfying Relationship Inequations 5 and 6.

$$n_{xp} > n_{zp}$$ [Relationship Inequation 5]

$$n_{yp} > n_{zp}$$ [Relationship Inequation 6]

In Relationship Inequations 5 and 6, $n_{xp}$ denotes a refractive index of the organic light emitting display panel in a direction where in-plane refractive index 100 is largest, $n_{yp}$ denotes a refractive index of the organic light emitting display panel in a direction where in-plane refractive index 100 is smallest, and $n_{zp}$ denotes a refractive index of the organic light emitting display panel in a thickness direction 100.

In one embodiment, for example, the organic light emitting display panel 100 may have predetermined optical anisotropy or a refractive index satisfying Relationship Inequation 7.

$$n_{xp} = n_{yp} > n_{zp}$$ [Relationship Inequation 7]

In Relationship Inequation 7, $n_{xp}$ denotes a refractive index of the organic light emitting display panel in a direction where in-plane refractive index 100 is largest, $n_{yp}$ denotes a refractive index of the organic light emitting display panel in a direction where in-plane refractive index 100 is smallest, and $n_{zp}$ denotes a refractive index of the organic light emitting display panel in a thickness direction 100.

In Relationship Inequation 7, the $n_{xp}$ and $n_{yp}$ may be substantially equivalent to each other or completely the same as each other. Herein, the $n_{xp}$ and $n_{yp}$ may be regarded as substantially equivalent to each other when the $n_{xp}$ and $n_{yp}$ have a refractive index difference of less than or equal to about 0.01, for example, less than or equal to about 0.001.

In one embodiment, for example, a thickness direction retardation of the organic light emitting display panel 100 may be in a range from about 20 nm to about 200 nm, or in a range from about 20 nm to about 100 nm.

Figure 7:
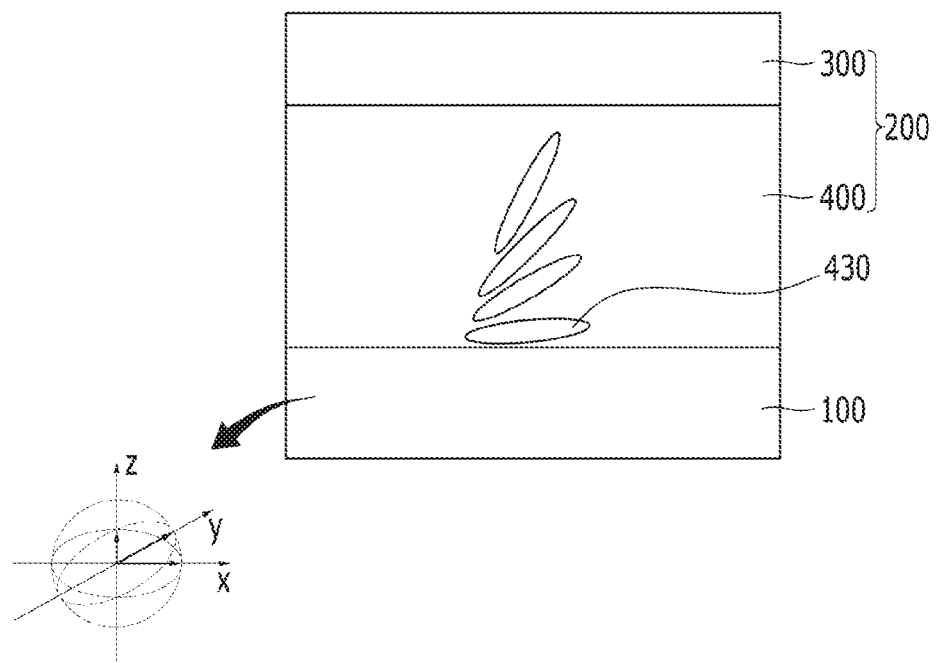

Referring to FIG. 7, another alternative embodiment of the organic light emitting diode device includes the organic light emitting display panel 100 having predetermined optical anisotropy and the circular polarizing plate 200 including the polarizer 300 and the compensation film 400. In such an embodiment, the compensation film 400 includes a liquid crystal layer including liquid crystals 430 obliquely tilted to a surface of the compensation film 400. Herein, the liquid crystals 430 obliquely tilted to the surface of the compensation film 400 mean the liquid crystals 430 tilted not to be vertically or horizontally oriented to the surface of the compensation film 400, and each liquid crystal 430 may be tilted with an angle of greater than about 0° to about 90° to the surface of the compensation film 400.

An angle with which the liquid crystals 430 is tilted to the surface of the compensation film 400 (hereinafter, referred to as a 'tilt angle') may be changed along the thickness direction of the compensation film 400, and the liquid crystals 430 may have a tilt angle gradually changed along the thickness direction of the compensation film 400. In such an embodiment, the liquid crystals 430 may be in a splayed arrangement.

In one embodiment, for example, when the compensation film 400 has a first surface facing the organic light emitting display panel 100 and a second surface facing the polarizer 300, the tilt angle of the liquid crystals 430 to the surface of the compensation film 400 may become gradually larger from the first surface to the second surface along the thickness direction of the compensation film 400. The compensation film 400 may further include an alignment layer disposed at the first surface of the compensation film 400.

In one embodiment, for example, where the compensation film 400 has a first surface facing the polarizer 300 and a second surface facing the organic light emitting display panel 100, tilt angles of the liquid crystals 430 that are tilted to a surface of the compensation film 400 may become gradually larger from the first surface to the second surface in a thickness direction of the compensation film 400. The compensation film 400 may further include an alignment layer disposed at the first surface of the compensation film 400.

The liquid crystals 430 on the first surface of the compensation film 400 may have, for example, a minimum tilt angle of greater than or equal to about 0° to less than about 15°, a minimum tilt angle in a range from about 2° to 10°, or a minimum tilt angle in a range about 2° to 5°, but the minimum tilt angle is not limited thereto.

The liquid crystals 430 on the second surface of the compensation film 400 may have, for example, a maximum tilt angle of less than or equal to about 90°, a maximum tilt angle in a range from about 15° to about 88°, a maximum tilt angle in a range from about 20° to 85°, a maximum tilt angle in a range from about 30° to 85°, or a maximum tilt angle in a range from about 40° to 85°, but the maximum tilt angle is not limited thereto.

In such an embodiment, since the compensation film 400 includes a plurality of liquid crystals 430 obliquely tilt to the surface, and the liquid crystals 430 have a tilt angle changed along the thickness direction of the compensation film 400, a thickness direction retardation may become larger. Accordingly, a circularly polarizing effect may be substantially equally realized in all directions, and thus an external light reflection may be effectively prevented at the side direction as well as the front direction, and visibility at the side direction may be improved.

In such an embodiment, the organic light emitting display panel 100 may have predetermined optical anisotropy, or refractive indices satisfying Relationship Inequations 5 and 6.

$$n_{xp} > n_{zp}$$ [Relationship Inequation 5]

$$n_{yp} > n_{zp}$$ [Relationship Inequation 6]

In Relationship Inequations 5 and 6, $n_{xp}$ denotes a refractive index of the organic light emitting display panel in a direction where in-plane refractive index 100 is largest, $n_{yp}$ denotes a refractive index of the organic light emitting display panel in a direction where in-plane refractive index 100 is smallest, and $n_{zp}$ denotes a refractive index of the organic light emitting display panel in a thickness direction 100.

In one embodiment, for example, the organic light emitting display panel 100 may have predetermined optical anisotropy or refractive indices satisfying Relationship Inequation 7.

$$n_{xp} = n_{yp} > n_{zp}$$ [Relationship Inequation 7]

In Relationship Inequation 7, $n_{xp}$ denotes a refractive index of the organic light emitting display panel in a direction where in-plane refractive index 100 is largest, $n_{yp}$ denotes a refractive index of the organic light emitting display panel in a direction where in-plane refractive index 100 is smallest, and $n_{zp}$ denotes a refractive index of the organic light emitting display panel in a thickness direction 100.

In Relationship Inequation 7, the $n_{xp}$ and $n_{yp}$ may be substantially equivalent to each other, or completely the same as each other. Herein, the $n_{xp}$ and $n_{yp}$ may be regarded as substantially equivalent when the $n_{xp}$ and $n_{yp}$ have a refractive index difference of less than or equal to about 0.01, for example, less than or equal to about 0.001.

In one embodiment, for example, a thickness direction retardation of the organic light emitting display panel 100 may be in a range from about 20 nm to about 200 nm, or in a range from about 20 nm to about 100 nm.

FIG. 2 is a schematic view showing an external light anti-reflection principle of a circular polarizing plate.

Referring to FIG. 2, while the incident unpolarized light, that is, external light having entered from the outside, is passed through the polarizer 300, only a first polarized perpendicular component, which is one polarized perpendicular component of two polarized perpendicular components, is transmitted, and the polarized light is changed into circularly polarized light by passing through the compensation film 400. While the circularly polarized light is reflected by a metal electrode of the organic light emitting display panel 100 and changes the circular polarization direction, and the circularly polarized light is sequentially passed through the compensation film 400, only a second polarized perpendicular component, which is the other polarized perpendicular component of the two polarized perpendicular components, may be transmitted. As the second polarized perpendicular component is not passed through the polarizer 300, and light does not exit to the outside, thereby effectively preventing the external light reflection.

in an embodiment, as described above, a retardation of the compensation film 400 determined or optically designed by considering a retardation of the organic light emitting display panel 100 in the first direction has a difference from a retardation when at least either one of reflectance and a reflection color of an organic light emitting diode device having the organic light emitting display panel 100 bonded with the circular polarizing plate 200 through optical anisotropy of the organic light emitting display panel 100 is minimized and thus may prevent deterioration of an anti-reflection effect and more effectively realize the anti-reflection effect.

Hereinafter, embodiments of the invention will be described in greater detail with reference to examples. However, these examples are merely exemplary, and the disclosure is not limited thereto.

Preparation of Circular Polarizing Plate

Preparation Example 1

A commercially available polycarbonate film R-140 (a λ/4 retardation film, Kaneka Corp.) is used as a first compensation film.

In addition, vertically-aligned liquid crystals are spin-coated on a non-elongated polycarbonate film and pre-cured. Subsequently, the liquid crystals are cured by radiating a light of ultra-violate ("UV") 500 millijoules (mJ) to prepare a second compensation film including a liquid crystal layer having refractive indices satisfying the following inequation: $n_{z2} > n_{x2} = n_{y2}$. Then, a first compensation film and a second compensation film are bonded by using a pressure sensitive adhesive ("PSA") to prepare a compensation film. Then, a polarizing plate (SEG1425DU, Nitto Denko Co. Ltd.) is adhered to the first compensation film to manufacture a circular polarizing plate.

The second compensation film has a retardation provided in Table 1, and the retardation is measured by using an Axoscan equipment (Axometrics Inc.) within a wavelength ranging from 400 nm to 800 nm at every 10° by controlling an incidence angle from −60° to 60°.

Preparation Examples 2 to 6

Each circular polarizing plate is manufactured according to the same method as Preparation Example 1 except for preparing a second compensation film having a different retardation as shown in Table 1 by changing the spin speed of spin-coating liquid crystals.

TABLE 1

| | In-plane retardation ($R_{e2}$, nm) (@ 550 nm) | Thickness direction retardation ($R_{th2}$, nm) (@ 550 nm) |
| --- | --- | --- |
| Preparation Example 1 | <3 | −62 |
| Preparation Example 2 | <3 | −85 |
| Preparation Example 3 | <3 | −98 |
| Preparation Example 4 | <3 | −122 |
| Preparation Example 5 | <3 | −133 |
| Preparation Example 6 | <3 | −140 |

Manufacture of Organic Light-emitting Diode Device

Examples 1 to 6

Each organic light emitting diode device is manufactured by respectively attaching the circular polarizing plates according to Preparation Examples 1 to 6 to an organic light emitting display panel (Galaxy S4 Panel, Samsung Display).

Reference Examples 1 to 6

Comparison samples are prepared by attaching the circular polarizing plates according to Preparation Examples 1 to 6 to a reflector instead of the organic light emitting display panel.

Evaluation 1

Each reflection color of the organic light emitting diode devices according to Examples 1 to 6 and Comparison samples according to Reference Examples 1 to 6 at the side direction of 45° are respectively measured to find out which organic light emitting diode device and Comparison sample have smallest reflection color.

The reflection colors may be expressed as $\Delta a^* b^* = \sqrt{a^{*2} + b^{*2}}$ by using a CIE-Lab color coordinate, where, positive a* indicates red, negative a* indicates green, positive b* indicates yellow, and negative b* indicates blue. A larger absolute value of the a* and the b* indicates a stronger color, a smaller reflection color indicates a color tone closer to black with a small color change, which exhibits satisfactory visibility due to reflection of external light. The reflection color is measured by using Shimadzu Solid-state 3700.

As a result, the organic light emitting diode device according to Example 4 shows the distribution of the smallest reflection color among the organic light emitting diode devices according to Examples 1 to 6 and orderly chromaticity, and the Comparison sample according to Reference Example 1 shows the distribution of the smallest reflection color among the Comparison samples according to Reference Examples 1 to 6 and orderly chromaticity.

Accordingly, when an organic light emitting display panel is actually disposed under a circular polarizing plate and when a reflector is disposed under the circular polarizing plate, the retardation of a compensation film showing a maximum anti-reflection effect may be different, and the organic light emitting display panel may have an effect on a retardation of the compensation film having a maximum anti-reflection effect.

Accordingly, in an embodiment, to substantially improve anti-reflection characteristics of an organic light emitting diode device, a retardation of the compensation film is desired to be determined or optically designed by considering a retardation of the organic light emitting display panel.

Optical Design of Compensation Film

Based on the results of Examples, the organic light emitting display panel is set to have a thickness direction retardation in a range from about 60 nm to 70 nm, and the compensation film is determined or optically designed to have a retardation minimizing reflectance and/or reflection color of an organic light emitting diode device.

Example 7

As for a simulation evaluation, a structure of an organic light emitting diode device, in which a polarizer, a first compensation film ($R_{e1}$=138 nm) having refractive indices satisfying the following inequations: $n_{x1} > n_{y1}$ and $n_{x1} > n_{z1}$, a second compensation film having refractive indices satisfying the following inequation: $n_{z2} > n_{x2} = n_{y2}$, and an organic light emitting display panel are sequentially stacked, is assumed, and then, reflectance and a reflection color of the light emitting diode device are evaluated depending on thickness direction retardation of the second compensation film.

Example 8

As for a simulation evaluation, a structure of an organic light emitting diode device, in which a polarizer, a compensation film ($R_{e1}$=138 nm) having refractive indices satisfying the following inequation: $n_{x3} > n_{z3} > n_{y3}$, and an organic light emitting display panel are sequentially stacked, is assumed, and then, reflectance and a reflection color of the organic light emitting diode device are evaluated depending on the thickness direction retardation of the compensation film.

Example 9

As for a simulation evaluation, a structure of an organic light emitting diode device, in which a polarizer, a liquid crystal compensation film, and an organic light emitting display panel are sequentially stacked, is assumed, and the liquid crystal compensation film has a structure that a plurality of liquid crystals has a tilt angle gradually changing along a thickness direction of the liquid crystal compensation film as shown in FIG. 7. Reflectance and a reflection color of the organic light emitting diode device are evaluated depending on maximum tilt angle of the liquid crystal.

Reference Examples 7 to 9

Each simulation evaluation is performed under the same condition as those of Examples 7 to 9 except for disposing a reflector instead of the organic light emitting display panel.

Evaluation 2

Reflectance and a reflection color of the structures of Examples 7 to 9 and Reference Examples 7 to 9 are evaluated. The reflectance and the reflection color are simulation-evaluated by using a LCD master (Shintech Inc.).

Figure 8:
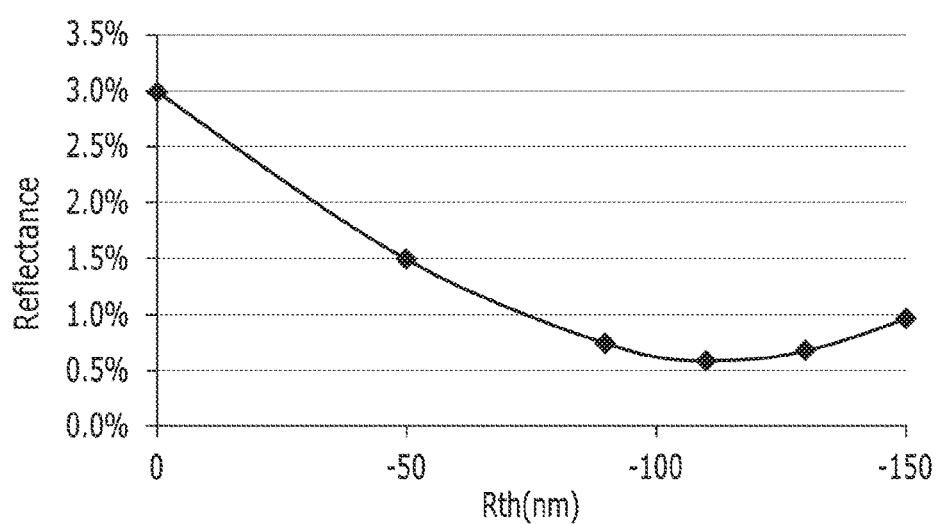
FIGS. 8 and 9 are graphs showing reflectance and reflection colors depending on thickness direction retardations of the second compensation film in the organic light emitting diode device according to Example 7.
Figure 9:
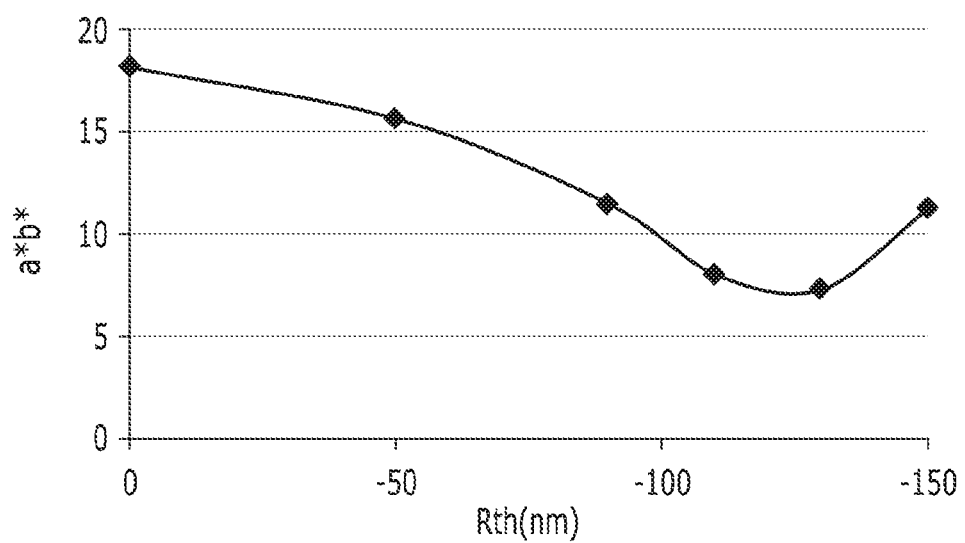
Figure 10:
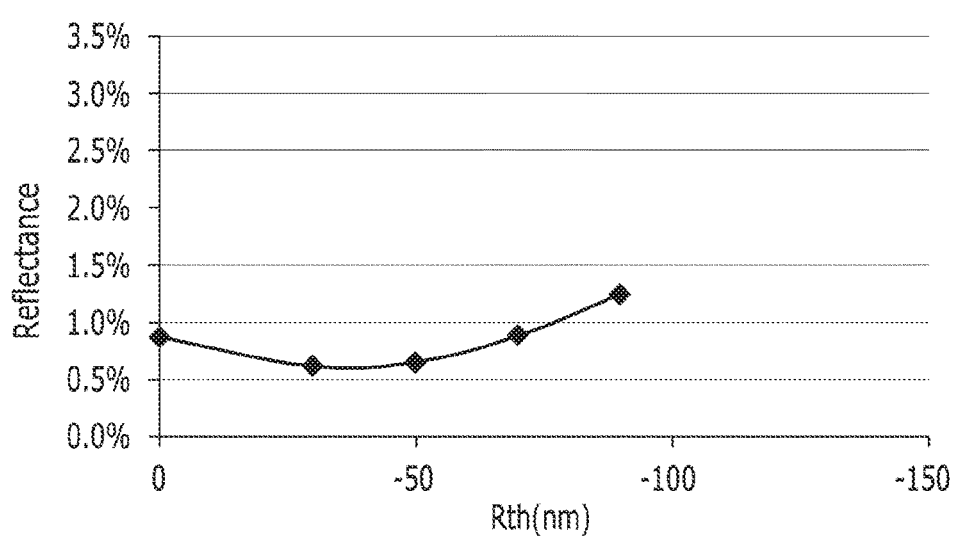
FIGS. 10 and 11 are graphs showing reflectance and reflection colors depending on thickness direction retardations of the second compensation film in the organic light emitting diode device according to Reference Example 7.
Figure 11:
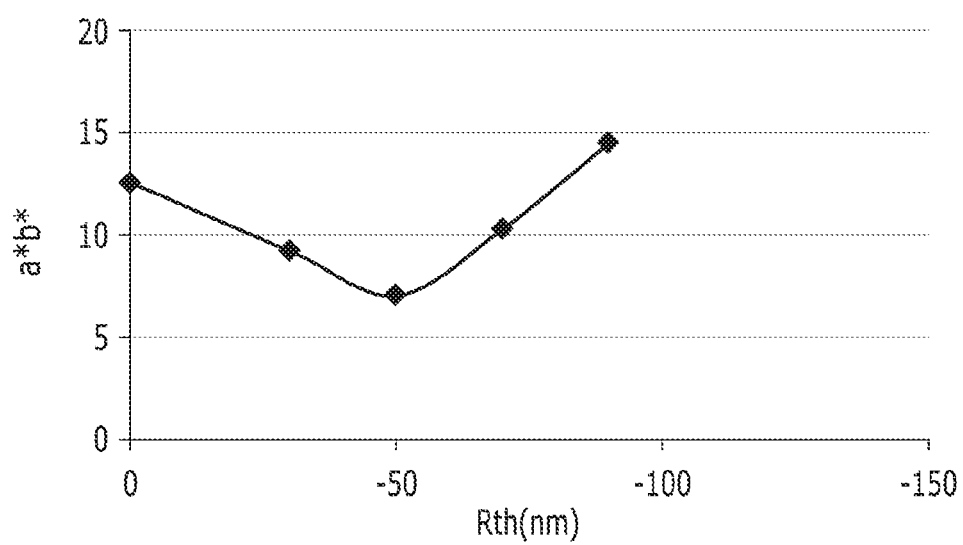
Figure 12:
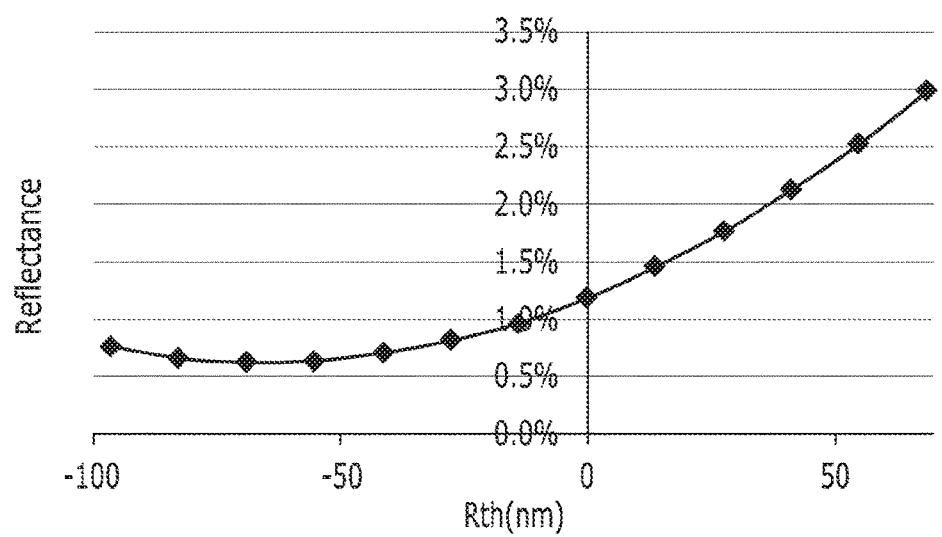
FIGS. 12 and 13 are graphs showing reflectance and reflection colors depending on thickness direction retardations of the compensation film in the organic light emitting diode device according to Example 8.
Figure 13:
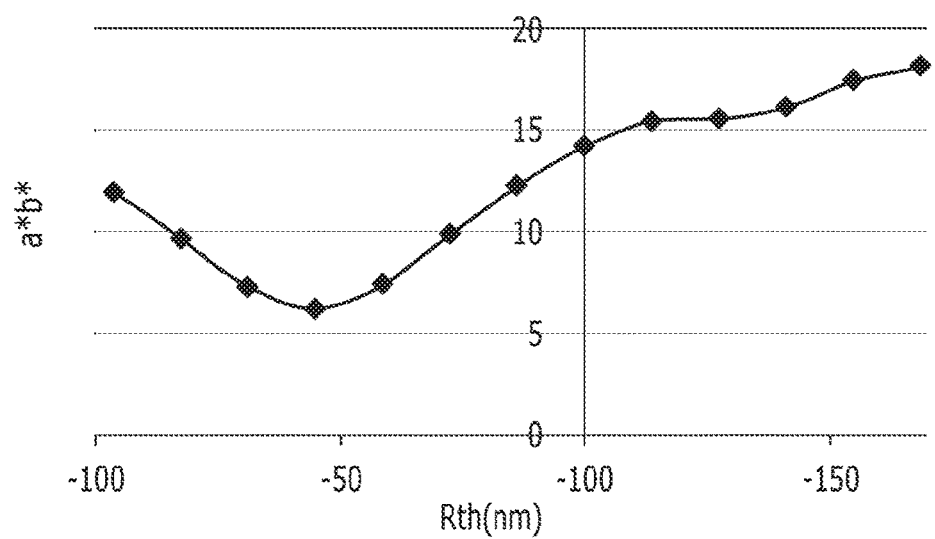
Figure 14:
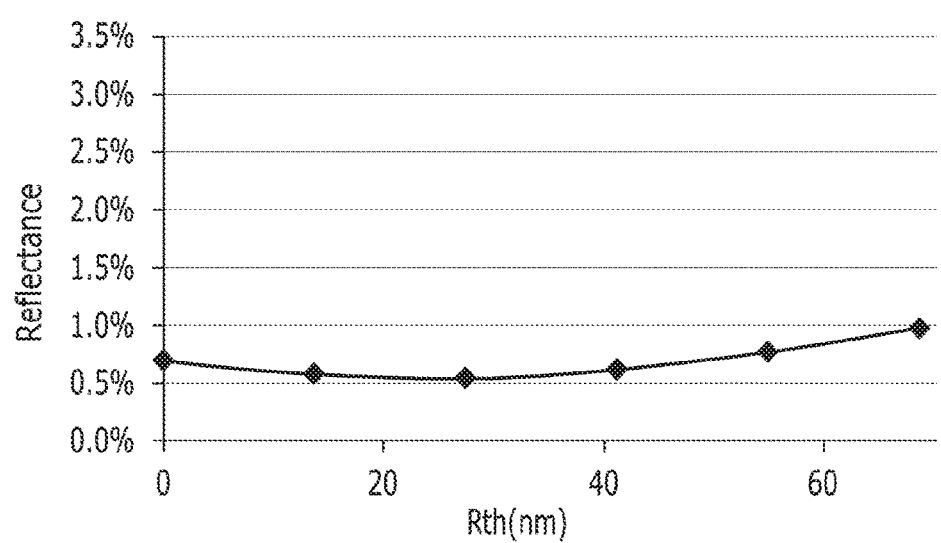
FIGS. 14 and 15 are graphs showing reflectance and reflection colors depending on thickness direction retardations of the compensation film in the organic light emitting diode device according to Reference Example 8.
Figure 15:
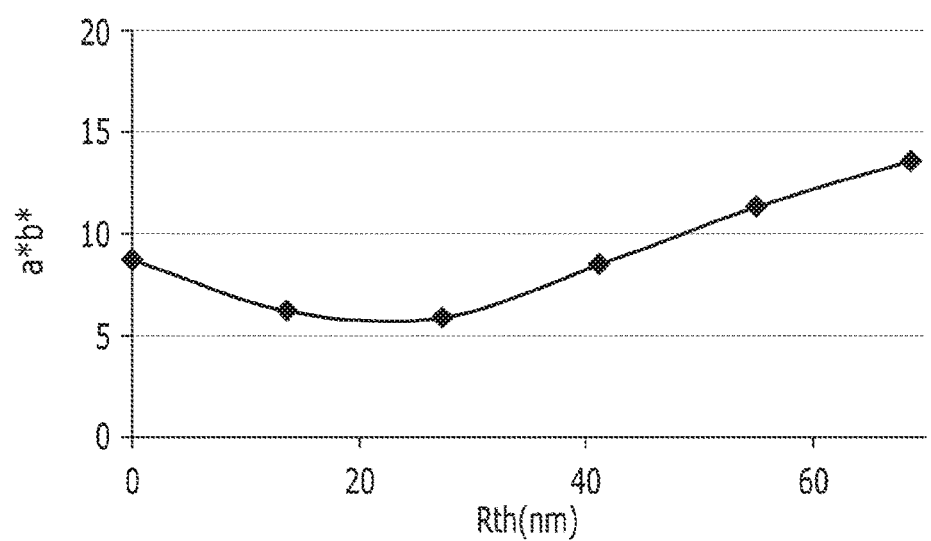
Figure 16:
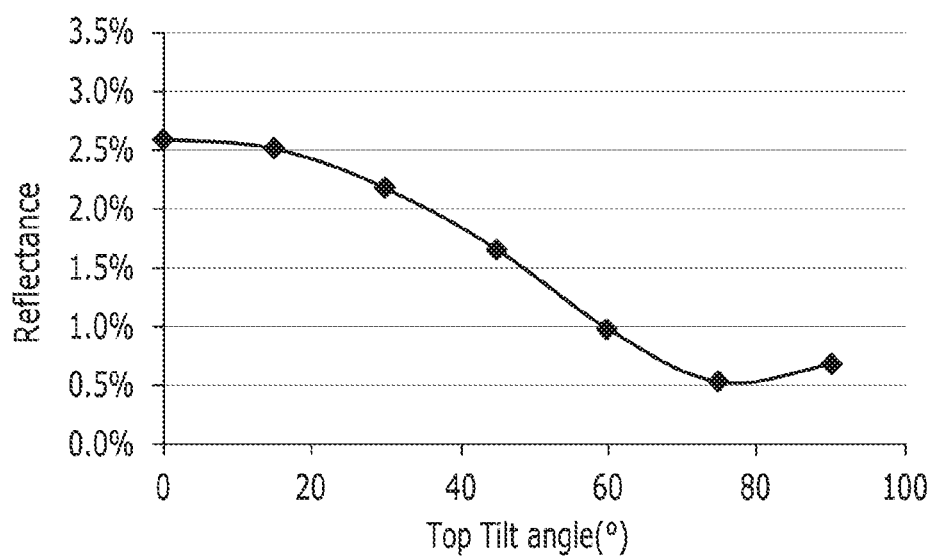
FIGS. 16 and 17 are graph showing reflectance and reflection colors depending on maximum tilt angles of liquid crystals in the organic light emitting diode device according to Example 9.
Figure 17:
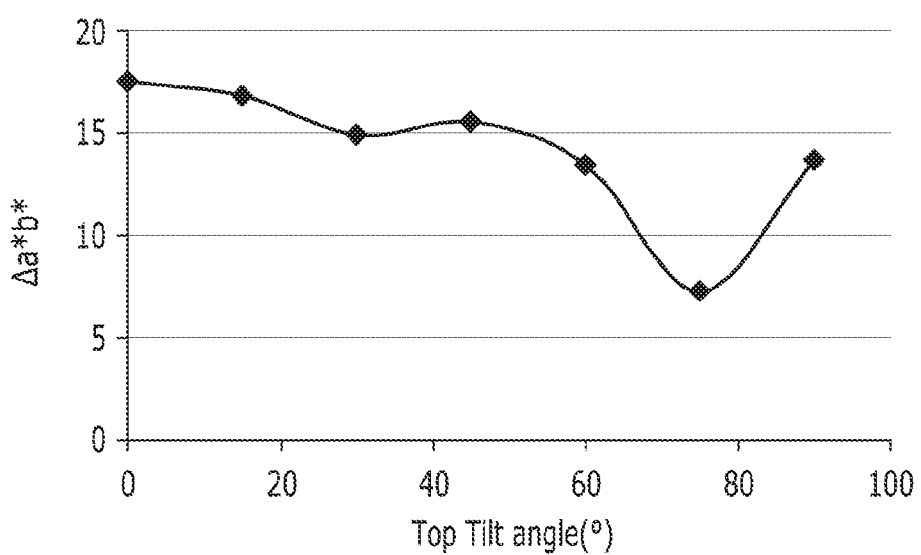
Figure 18:
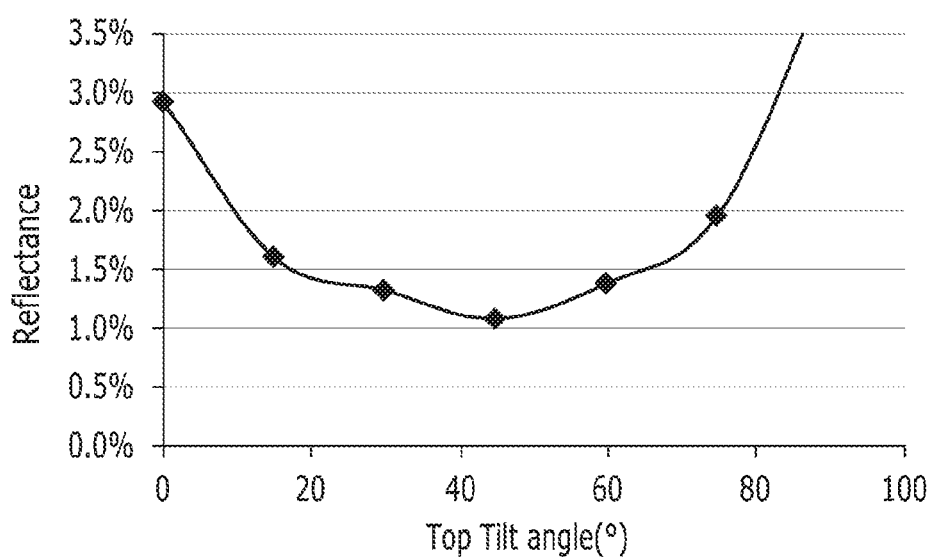
FIGS. 18 and 19 are graph showing reflectance and reflection colors depending on maximum tilt angles of liquid crystals in the organic light emitting diode device according to Reference Example 9.
Figure 19:
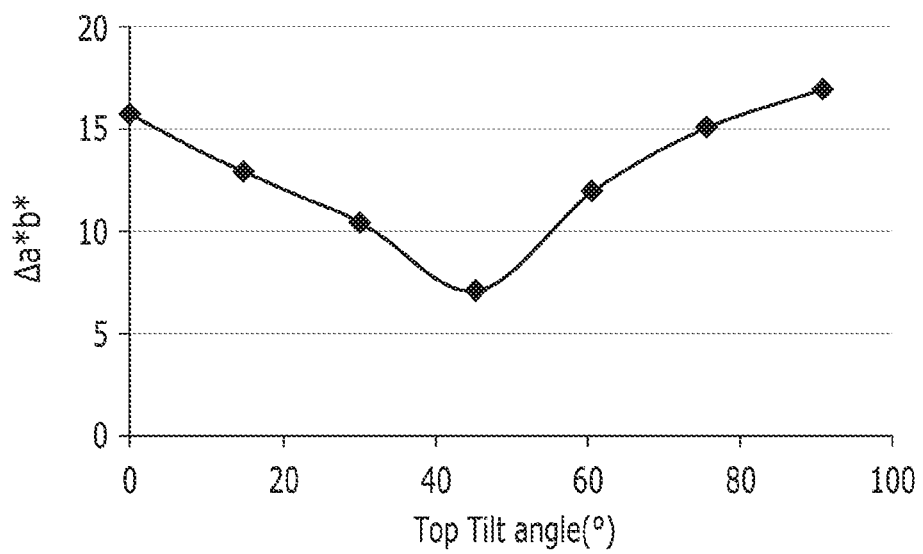

FIGS. 8 and 9 are graphs showing reflectance and reflection colors depending on thickness direction retardations of the second compensation films in the structure according to Example 7, FIGS. 10 and 11 are graphs showing reflectance and a reflection color depending on thickness direction retardation of the second compensation film in the structure according to Reference Example 7, FIGS. 12 and 13 are graphs showing reflectance and a reflection color depending on a thickness direction retardation of the compensation film in the structure according to Example 8, FIGS. 14 and 15 are graphs showing reflectance and a reflection color depending on a thickness direction retardation of the compensation film in the structure according to Reference Example 8, FIGS. 16 and 17 are graph showing reflectance and a reflection color depending on a maximum tilt angle of liquid crystals in the structure according to Example 9, and FIGS. 18 and 19 are graph showing reflectance and a reflection color depending on a maximum tilt angles of liquid crystals in the structure according to Reference Example 9.

Referring to FIGS. 8 to 11, the structure of Example 7 has a different retardation minimizing reflectance and/or a reflection color from that of the structure of Reference Example 7.

Likewise, referring to FIGS. 12 to 15, the structure of Example 8 has a different retardation minimizing reflectance and/or a reflection color from that of the structure of Reference Example 8.

Likewise, referring to FIGS. 16 to 19, the structure of Example 9 has a different maximum tilt angle of liquid crystals minimizing reflectance and/or a reflection color from that of the structure of Reference Example 9.

Accordingly, in an embodiment, an anti-reflection effect of the organic light emitting diode device may be practically and effectively improved by designing a retardation of the compensation film by considering a retardation of the organic light emitting display panel.

While the disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode device, comprising:
an organic light emitting display panel; and
a circular polarizing plate disposed on the organic light emitting display panel and comprising a polarizer and a compensation film, wherein a retardation of the compensation film in a first direction is determined based on a retardation of the organic light emitting display panel in the first direction, and wherein the retardation of the compensation film in the first direction is different from a retardation of the compensation film in the first direction set to allow at least one of reflectance and a reflection color of the circular polarizing plate in a side direction, which is measured while a reflector is disposed under the circular polarizing plate, to be minimum, wherein the retardation of the compensation film in the first direction satisfies the following relationship inequation:

$|R_{c1}-R_p| \times 0.6 \leq R_{c2} \leq |R_{c1}-R_p| \times 1.4$, wherein $R_{c2}$ denotes the retardation of the compensation film in the first direction, $R_{c1}$ denotes a retardation of the compensation film in the first direction set to allow at least one of reflectance and a reflection color of the circular polarizing plate in a side direction, which is measured while a reflector is disposed under the circular polarizing plate, to be minimum, and $R_p$ denotes the retardation of the organic light emitting display panel in the first direction.

2. The organic light emitting diode device of claim 1, wherein
the retardation of the compensation film in the first direction satisfies the following relationship inequation:

$|R_{c2}|-|R_{c1}|>0$.

3. The organic light emitting diode device of claim 1, wherein
the retardation of the compensation film in the first direction is a thickness direction retardation of the compensation film, and
the retardation of the organic light emitting display panel in the first direction is a thickness direction retardation of the organic light emitting display panel.

4. The organic light emitting diode device of claim 1, wherein the organic light emitting display panel comprises an organic layer comprising an aligned organic molecule.

5. The organic light emitting diode device of claim 1, wherein the organic light emitting display panel comprises an organic layer comprising a deposited organic molecule.

6. The organic light emitting diode device of claim 1, wherein the organic light emitting display panel has a microcavity structure.

7. The organic light emitting diode device of claim 1, wherein
the retardation of the compensation film in the first direction satisfies the following relationship inequation:

$|R_{c1}-R_p| \times 0.8 \leq R_{c2} \leq |R_{c1}-R_p| \times 1.2$.

8. The organic light emitting diode device of claim 7, wherein
the organic light emitting display panel has refractive indices satisfying the following relationship inequations:

$n_{xp} > n_{zp}$; and $n_{yp} > n_{zp}$, wherein $n_{xp}$ denotes a refractive index of the organic light emitting display panel in a direction where in-plane refractive index is largest, $n_{yp}$ denotes a refractive index of the organic light emitting display panel in a direction where in-plane refractive index is smallest, and $n_{zp}$ denotes a refractive index of the organic light emitting display panel in a thickness direction.

9. The organic light emitting diode device of claim 7, wherein the organic light emitting display panel has refractive indices satisfying the following relationship inequation:

$$n_{xp}=n_{yp}>n_{zp},$$

wherein $n_{xp}$ denotes a refractive index of the organic light emitting display panel in a direction where in-plane refractive index is largest, $n_{yp}$ denotes a refractive index of the organic light emitting display panel in a direction which in-plane refractive index is smallest, and $n_{zp}$ denotes a refractive index of the organic light emitting display panel in a thickness direction.

10. The organic light emitting diode device of claim 7, wherein a thickness direction retardation of the organic light emitting display panel is in a range from about 20 nanometers to about 200 nanometers.

11. The organic light emitting diode device of claim 1, wherein the compensation film comprises:

a first compensation film having refractive indices satisfying the following relationship inequations:

$$n_{x1}>n_{y1}; \text{ and}$$

$$n_{x1}>n_{z1}, \text{ and}$$

a second compensation film having refractive indices satisfying the following relationship inequation:

$$n_{z2}>n_{x2}=n_{y2},$$

wherein $n_{x1}$ denotes a refractive index of the first compensation film in a direction where in-plane refractive index is largest, $n_{y1}$ denotes a refractive index of the first compensation film in a direction where in-plane refractive index is smallest, $n_{z1}$ denotes a refractive index of the first compensation film in a thickness direction, $n_{x2}$ denotes a refractive index of the second compensation film in a direction where in-plane refractive index is largest, $n_{y2}$ denotes a refractive index of the second compensation film in a direction where in-plane refractive index is smallest, and $n_{z2}$ denotes a refractive index of the second compensation film in a thickness direction.

12. The organic light emitting diode device of claim 11, wherein the first compensation film has an in-plane retardation in a range from about 110 nanometers to about 160 nanometers.

13. The organic light emitting diode device of claim 11, wherein the first compensation film comprises:

a third compensation film having an in-plane retardation in a range from about 110 nanometers to about 160 nanometers, and a fourth compensation film having an in-plane retardation in a range from about 220 nanometers to about 320 nanometers.

14. The organic light emitting diode device of claim 11, wherein the organic light emitting display panel has refractive indices satisfying the following relationship inequations:

$$n_{xp}>n_{zp}; \text{ and}$$

$$n_{yp}>n_{zp},$$

wherein $n_{xp}$ denotes a refractive index of the organic light emitting display panel in a direction where in-plane refractive index is largest, $n_{yp}$ denotes a refractive index of the organic light emitting display panel in a direction where in-plane refractive index is smallest, and $n_{zp}$ denotes a refractive index of the organic light emitting display panel in a thickness direction.

15. The organic light emitting diode device of claim 11, wherein the organic light emitting display panel has refractive indices satisfying the following relationship inequation:

$$n_{xp}=n_{yp}>n_{zp},$$

wherein $n_{xp}$ denotes a refractive index of the organic light emitting display panel in a direction where in-plane refractive index is largest, $n_{yp}$ denotes a refractive index of the organic light emitting display panel in a direction where in-plane refractive index is smallest, and $n_{zp}$ denotes a refractive index of the organic light emitting display panel in a thickness direction.

16. The organic light emitting diode device of claim 11, wherein each of the first compensation film and the second compensation film comprises a polymer, a liquid crystal, or a combination thereof.

17. The organic light emitting diode device of claim 1, wherein the compensation film comprises a polymer film having refractive indices satisfying the following relationship inequation:

$$n_{x3}>n_{z3}>n_{y3}; \text{ or}$$

$$n_{z3} \geq n_{x3}>n_{y3},$$

wherein $n_{x3}$ denotes a refractive index of the polymer film in a direction where in-plane refractive index is largest, $n_{y3}$ denotes a refractive index of the polymer film in a direction where in-plane refractive index is smallest, and $n_{z3}$ denotes a refractive index of the polymer film in a thickness direction.

18. The organic light emitting diode device of claim 17, wherein the organic light emitting display panel has refractive indices satisfying the following relationship inequations:

$$n_{xp}>n_{zp}; \text{ and}$$

$$n_{yp}>n_{zp},$$

wherein $n_{xp}$ denotes a refractive index of the organic light emitting display panel in a direction where in-plane refractive index is largest, $n_{yp}$ denotes a refractive index of the organic light emitting display panel in a direction where in-plane refractive index is smallest, and $n_{zp}$ denotes a refractive index of the organic light emitting display panel in a thickness direction.

19. The organic light emitting diode device of claim 17, wherein the organic light emitting display panel has refractive indices satisfying the following relationship inequation:

$$n_{xp}=n_{yp}>n_{zp},$$

wherein $n_{xp}$ denotes a refractive index of the organic light emitting display panel in a direction wherein-plane refractive index is largest, $n_{yp}$ denotes a refractive index of the organic light emitting display panel in a direction where in-plane refractive index is smallest, and $n_{zp}$ denotes a refractive index of the organic light emitting display panel in a thickness direction.

20. The organic light emitting diode device of claim 1, wherein the compensation film comprises a liquid crystal layer comprising liquid crystals which are obliquely tilted to a surface of the compensation film, and tilt angles of the liquid crystals with respect to the surface of the compensation film becomes gradually larger in a thickness direction of the compensation film.

21. The organic light emitting diode device of claim 20, wherein the liquid crystal layer has a first surface facing the organic light emitting display panel and a second surface facing the polarizer, and tilt angles of the liquid crystals with respect to a surface of the compensation film becomes gradually larger from the first surface to the second surface in a thickness direction of the compensation film.

22. The organic light emitting diode device of claim 20, wherein the liquid crystal layer has a first surface facing the polarizer and a second surface facing the organic light emitting display panel, and tilt angles of the liquid crystals with respect to the surface of the compensation film become gradually larger from the first surface to the second surface in a thickness direction of the compensation film.

23. The organic light emitting diode device of claim 20, wherein the organic light emitting display panel has refractive indices satisfying the following relationship inequations:

$$n_{xp}>n_{zp}; \text{ and}$$

$$n_{yp}>n_{zp},$$

wherein $n_{xp}$ denotes a refractive index of the organic light emitting display panel in a direction where in-plane refractive index is largest, $n_{yp}$ denotes a refractive index of the organic light emitting display panel in a direction where in-plane refractive index is smallest, and $n_{zp}$ denotes a refractive index of the organic light emitting display panel in a thickness direction.

24. The organic light emitting diode device of claim 20, wherein the organic light emitting display panel has refractive indices satisfying relationship inequation:

$$n_{xp}=n_{yp}>n_{zp},$$

wherein $n_{xp}$ denotes a refractive index of the organic light emitting display panel in a direction where in-plane refractive index is largest, $n_{yp}$ denotes a refractive index of the organic light emitting display panel in a direction where in-plane refractive index is smallest, and $n_{zp}$ denotes a refractive index of the organic light emitting display panel in a thickness direction.

25. The organic light emitting diode device of claim 20, wherein the compensation film further comprises an alignment layer contacting the liquid crystal layer.

26. A circular polarizing plate for an organic light emitting diode device comprising:

a polarizer; and a compensation film, wherein a retardation of the compensation film in a first direction satisfies the following relationship inequation:

$$|R_{c2}|-|R_{c1}|>0,$$

wherein $R_{c2}$ denotes the retardation of the compensation film in the first direction, and $R_{c1}$ denotes a retardation of the compensation film in the first direction set to allow at least one of reflectance and a reflection color of the circular polarizing plate in a side direction, which is measured while a reflector is disposed under the circular polarizing plate, to be minimum, wherein the retardation of the compensation film in the first direction satisfies the following relationship inequation:

$$|R_{c1}-R_p|\times 0.6 \le R_{c2} \le |R_{c1}-R_p|\times 1.4,$$

$R_p$ denotes the retardation of the organic light emitting display panel in the first direction.

27. The circular polarizing plate of claim 26, wherein the retardation of the compensation film in the first direction is a thickness direction retardation of the compensation film.

28. A compensation film for a circular polarizing plate, for an organic light emitting diode device, wherein the compensation film has a retardation in a first direction satisfying the following relationship inequation:

$$|R_{c2}|-|R_{c1}|>0,$$

wherein $R_{c2}$ denotes the retardation of the compensation film in the first direction, and $R_{c1}$ denotes a retardation of the compensation film in the first direction set to allow at least one of reflectance and a reflection color of the circular polarizing plate in a side direction, which is measured while a reflector is disposed under the circular polarizing plate, to be minimum, wherein
the retardation of the compensation film in the first direction satisfies the following relationship inequation:

$$|R_{c1}-R_p|\times 0.6 \leq R_{c2} \leq |R_{c1}-R_p|\times 1.4,$$

wherein $R_p$ denotes the retardation of the organic light emitting display panel in the first direction.

29. The compensation film of claim 28, wherein the retardation of the compensation film in the first direction is a thickness direction retardation of the compensation film.

* * * * *